(12) United States Patent
Song

(10) Patent No.: US 12,254,283 B2
(45) Date of Patent: Mar. 18, 2025

(54) ARITHMETIC DEVICES FOR NEURAL NETWORK

(71) Applicant: SK hynix Inc., Icheon-si (KR)

(72) Inventor: Choung Ki Song, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 1108 days.

(21) Appl. No.: 17/144,004

(22) Filed: Jan. 7, 2021

(65) Prior Publication Data

US 2021/0133546 A1 May 6, 2021

Related U.S. Application Data

(63) Continuation-in-part of application No. 16/919,786, filed on Jul. 2, 2020, now Pat. No. 11,915,125.

(Continued)

(30) Foreign Application Priority Data

Oct. 31, 2019 (KR) .......................... 10-2019-0138114

(51) Int. Cl.
  G06F 7/544 (2006.01)
  G06N 3/063 (2023.01)
  G11C 8/10 (2006.01)

(52) U.S. Cl.
  CPC .......... G06F 7/5443 (2013.01); G06N 3/063 (2013.01); G11C 8/10 (2013.01)

(58) Field of Classification Search
  CPC ................... G06F 7/544; G06F 7/5443; G06F 2207/4824; G06F 1/03; G06F 17/10; G06N 3/048; G06N 3/063; G11C 8/10
  See application file for complete search history.

(56) References Cited

U.S. PATENT DOCUMENTS 6,414,687 B1   7/2002   Gibson
10,592,247 B2  3/2020   Tanaka
(Continued)

FOREIGN PATENT DOCUMENTS

CN   109964209 A   7/2019
CN   110009092 A   7/2019
(Continued)

OTHER PUBLICATIONS

Coric et al., "A Neural Network FPGA Implementation", Aug. 6, 2002, Proceedings of the 5th Seminar on Neural Network Applications in Electrical Engineering. NEUREL 2000 (IEEE Cat. No. 00EX287), pp. 117-120, University of Belgrade, Yugoslavia.

*Primary Examiner* — Andrew Caldwell
*Assistant Examiner* — Carlo Waje
(74) *Attorney, Agent, or Firm* — WILLIAM PARK & ASSOCIATES LTD.

(57) ABSTRACT

An arithmetic device includes an activation function (AF) control circuit, a data storage circuit, and an output distribution signal generation circuit. The AF control circuit generates a column address, a data selection signal, and an internal control signal based on an arithmetic result signal during an activation operation. The data storage circuit outputs activation data from a memory cell array that is selected by the column address and a row address. The output distribution signal generation circuit generates an output distribution signal from the activation data based on the data selection signal and the internal control signal.

29 Claims, 45 Drawing Sheets

Related U.S. Application Data

(60) Provisional application No. 62/959,593, filed on Jan. 10, 2020, provisional application No. 62/959,574, filed on Jan. 10, 2020, provisional application No. 62/958,609, filed on Jan. 8, 2020, provisional application No. 62/958,614, filed on Jan. 8, 2020.

(56) References Cited

U.S. PATENT DOCUMENTS

| | | | |
|---|---|---|---|
| 10,740,432 B1* | 8/2020 | Diamant | G06N 3/045 |
| 2014/0067889 A1 | 3/2014 | Mortensen et al. | |
| 2017/0365306 A1 | 12/2017 | Ouyang et al. | |
| 2021/0117155 A1* | 4/2021 | Vasyltsov | G06F 7/544 |
| 2022/0012586 A1* | 1/2022 | Lin | G06N 5/04 |
| 2022/0276837 A1 | 9/2022 | Fujinami | |

FOREIGN PATENT DOCUMENTS

| | | |
|---|---|---|
| CN | 110060714 A | 7/2019 |
| KR | 1020180053314 A | 5/2018 |

* cited by examiner

ARITHMETIC DEVICES FOR NEURAL NETWORK

CROSS-REFERENCE TO RELATED APPLICATIONS

The present application is a continuation-in-part of U.S. patent application Ser. No. 16/919,786, filed on Jul. 2, 2020, which claims priority under 35 U.S.C 119(a) to Korean Application No. 10-2019-0138114, filed on Oct. 31, 2019, Provisional Patent Application No. 62/958,614, filed on Jan. 8, 2020, Provisional Patent Application No. 62/958,609, filed on Jan. 8, 2020, Provisional Patent Application No. 62/959,574, filed on Jan. 10, 2020, and Provisional Patent Application No. 62/959,593, filed on Jan. 10, 2020, which is incorporated herein by reference in its entirety.

BACKGROUND

1. Technical Field

Embodiments of the present disclosure generally relate to arithmetic devices for a neural network.

2. Related Art

In a neural network, neurons mathematically modelled to resemble to a human brain are connected to each other to form a network. Recently, neural network technologies have been developed fast. Accordingly, a lot of effort has been focused on analyzing input data and extracting useful information by using the neural network technologies in various electronic devices.

SUMMARY

According to an embodiment, an arithmetic device includes an activation function (AF) control circuit, a data storage circuit, and an output distribution signal generation circuit. The AF control circuit is configured to generate a column address, a data selection signal, and an internal control signal based on an arithmetic result signal during an activation operation. The data storage circuit is configured to output activation data from a memory cell array that is selected by the column address and a row address. The output distribution signal generation circuit is configured to generate an output distribution signal from the activation data based on the data selection signal and the internal control signal.

According to another embodiment, an arithmetic device includes a data storage circuit, a data selector, and an output distribution signal output circuit. The data storage circuit is configured to output activation data from a memory cell array that is selected by a column address, generated from an arithmetic result signal and a row address. The data selector is configured to select and output a portion of internal activation data, which are generated by buffering the activation data, as selected activation data based on a data selection signal that is generated from the arithmetic result signal. The output distribution signal output circuit is configured to latch the selected activation data based on an internal control signal that is generated from the arithmetic result signal to generate and output an output distribution signal.

DETAILED DESCRIPTION

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal with a logic "high" level may be distinguished from a signal with a logic "low" level. For example, when a signal with a first voltage correspond to a signal with a logic "high" level, a signal with a second voltage correspond to a signal with a logic "low" level. In an embodiment, the logic "high" level may be set as a voltage level that is higher than a voltage level of the logic "low" level. Meanwhile, logic levels of signals may be set to be different or opposite according to the embodiments. For example, a certain signal with a logic "high" level in one embodiment may be set to have a logic "low" level in another embodiment.

Various embodiments of the present disclosure will be described hereinafter with reference to the accompanying drawings. However, the embodiments described herein are for illustrative purposes only and are not intended to limit the scope of the present disclosure.

Figure 1:
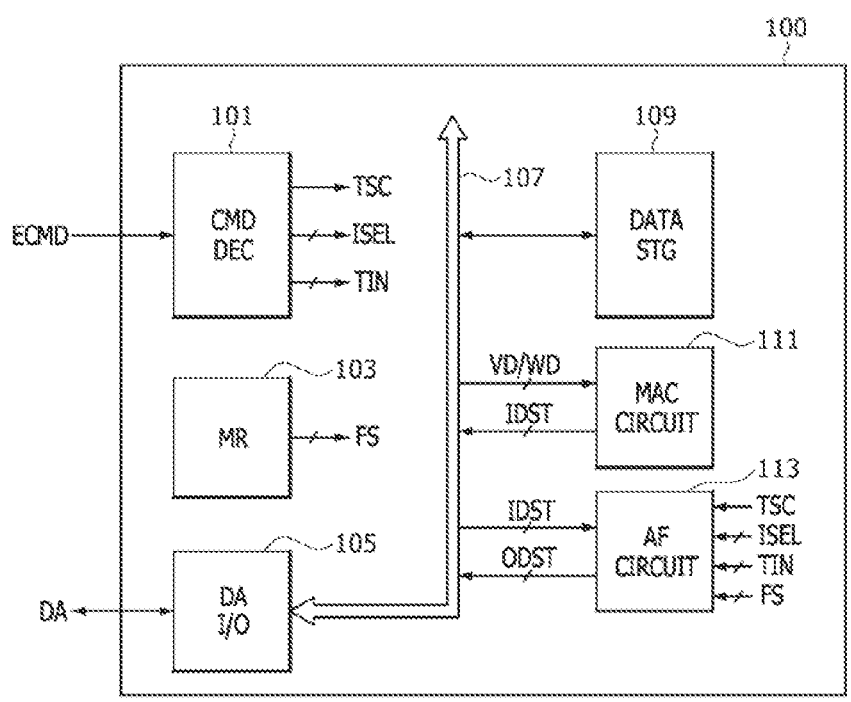
FIG. 1 is a block diagram illustrating a configuration of an arithmetic device according to an embodiment of the present disclosure.

As illustrated in FIG. 1, an arithmetic device 100 may include command decoder 101, a mode register 103, a data input/output circuit 105, a data line 107, a data storage circuit 109, a MAC circuit 111 and an AF circuit 113.

The command decoder 101 may generate a table set signal TSC, an input selection signal ISEL, and a table input signal TIN based on an external command ECMD. The number of bits that are included in the input selection signal ISEL may be set to be different according to the embodiments. The number of bits that are included in the table input signal TIN may be set to be different according to the embodiments.

The command decoder 101 may decode external command ECMD to generate the table set signal TSC. The table set signal TSC may be activated to store an activation function used for a neural network into a first table storage circuit (133 of FIG. 3) in a look-up table form. The number of bits that are included in the external command ECMD to activate the table set signal TSC may be set to be different according to the embodiments. In addition, a logic level combination of the external command ECMD to activate the table set signal TSC may be set to be different according to the embodiments. The lookup table has a table form that contains information about an input value and the output value that corresponds to the input value. When by using the lookup table, the output value that corresponds to the input value can be printed directly without any arithmetic, thus improving the arithmetic speed.

The command decoder 101 may decode the external command ECMD to generate the input selection signal ISEL and the table input signal TIN. The input selection signal ISEL and the table input signal TIN may be generated to store the activation function into first to $N^{th}$ variable latches (149_1~149_N of FIG. 4) included in the first table storage circuit (133 of FIG. 3) in a look-up table form. The table input signal TIN may be stored in one variable latch selected by the input selection signal ISEL among the first to $N^{th}$ variable latches (149_1~149_N of FIG. 4). A logic level combination of the external command ECMD for setting logic level combinations of the table input signal TIN may be set to be different according to the embodiments. A logic level combination of the external command ECMD for setting logic level combinations of the input selection signal ISEL may be set to be different according to the embodiments.

The mode register 103 may store a function selection signal FS through a mode register set. The mode register 103 may output the function selection signal FS through a mode register read. The mode register set and the mode register read are common operations for the mode register 139, so the specific description is omitted. The mode register 103 may apply the function selection signal FS to the AF circuit 113. The function selection signal FS may be generated to select one of various activation functions that are used for a neural network. The various activation functions used for a neural network may include, but are not limited to, sigmoid (i.e., sigmoid function), Tanh (i.e., hyperbolic tangent activation function), ReLU (i.e., rectified linear unit function), leaky ReLU (i.e., leaky rectified linear unit function), Maxout (i.e., max out activation function), and an activation function that is input based on the external command ECMD. The number of bits that are included in the function selection signal FS may be set to be different according to the embodiments. The mode register 103 can be located on the external side of the arithmetic device 100, for example, on a host or a memory controller.

The data input/output circuit 105 may receive external data DA from the external side of the arithmetic device 100, and transmit the external data DA to at least one of the data storage circuit 109 and the MAC circuit 111 through the data line 107. The data input/output circuit 105 may output data from at least one of the data storage circuit 109, the MAC circuit 111 and the AF circuit 113 through the data line 107 to the external data DA.

The data storage circuit 109 may be stored internally by receiving the external data DA received from the data input/output circuit 105 through the data line 107 in a write operation. The data storage circuit 109 may transmit the data stored internally to the data input/output circuit 105 through the data line 107 and output it to the external data DA in read operation.

The MAC circuit 111 may receive vector data VD and weight data WD. The MAC circuit 111 may receive the vector data VD from the data input/output circuit 105 or data storage circuit 109. The MAC circuit 111 may receive the weight data WD from the data input/output circuit 105 or data storage circuit 109. The MAC circuit 111 may perform MAC arithmetic operation on the vector data VD and the weight data WD, and generate an input distribution signal IDST based on the results of MAC arithmetic operation.

The MAC arithmetic operation may include a multiplying operation and an accumulating operation for the vector data VD and the weight data WD. When the vector data VD and the weight data WD are implemented in matrix format, the MAC arithmetic operations may include multiple multiplying operations and multiple accumulating operations for elements contained in matrix with the vector data VD implemented and elements contained in matrix with the weight data WD implemented. In the neural network, the MAC arithmetic operations are performed to classify features contained in an input layer into resulting values contained in an output layer. The vector data VD may contain information about features contained in the Input layer. The weight data WD may contain information about the influence on classifying features of the input layers as results contained in the output layers. The MAC circuit 111 may receive an output distribution signal ODST from the AF circuit 113 as the vector data VD when multiple layers are applied in perceptron.

The AF circuit 113 may store the activation functions used for a neural network into the first table storage circuit (133 of FIG. 3) in a look-up table form, based on the table set signal TSC, the input selection signal ISEL, and the table input signal TIN. The lookup table stored in the AF circuit 113 includes information regarding the relationship between the input distribution signal IDST and the output distribution signal ODST. The output distribution signal ODST can be defined as the value derived when the input distribution signal IDST is applied to an activation function. The AF circuit 113 may store the table input signal TIN into one variable latch selected by the input selection signal ISEL among the first to $N^{th}$ variable latches (149_1~149_N of FIG. 4) when the table set signal TSC is activated. Various activation functions used for a neural network, for example, sigmoid, Tanh, ReLU, leaky ReLU, and Maxout may be hardwired into the AF circuit 113. The number of the activation functions hardwired in the AF circuit 113 may be set to be different according to the embodiments.

The AF circuit 113 may select one of the various activation functions based on the function selection signal FS. The AF circuit 113 may generate a result value provided by an activation function selected by the function selection signal FS based on the input distribution signal IDST. The AF circuit 113 may extract a result value that corresponds to the input distribution signal IDST from a look-up table to which an activation function selected by the function selection signal FS is applied, thereby outputting the result value as an output distribution signal ODST. A configuration and an operation of the AF circuit 113 will be described with reference to FIGS. 3 to 7.

Figure 2:
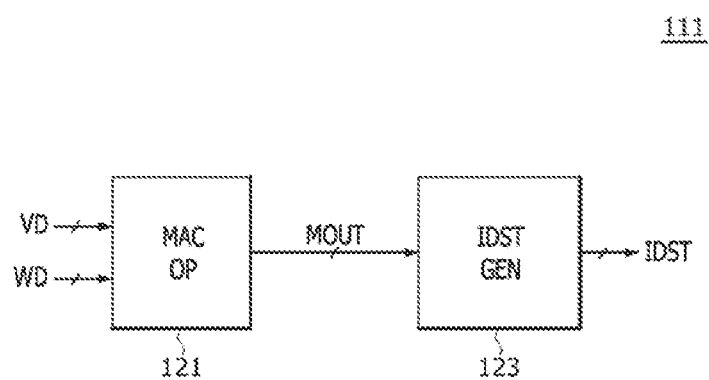
FIG. 2 is a block diagram illustrating a configuration of MAC circuit included in the arithmetic device of FIG. 1.

Referring to FIG. 2, the MAC circuit 111 may include an MAC operator 121 and an input distribution signal generation circuit 123. The MAC operator 121 may receive the vector data VD and the weight data WD and may perform the MAC arithmetic operation with a multiplying operation and an accumulating operation to generate an arithmetic result signal MOUT. The input distribution signal generation circuit 123 may extract only some bits among bits of the arithmetic result signal MOUT to generate the input distribution signal IDST. For example, when the arithmetic result signal MOUT contains bits that correspond to the integer and bits that correspond to the decimal part, the input distribution signal IDST can be selected as the bits that correspond to the integer from among the bits contained in the arithmetic result signal MOUT. The number of bits of the arithmetic result signal MOUT may be set to be different according to the embodiments. In addition, the number of bits of the input distribution signal IDST may also be set to be different according to the embodiments. The number of bits of the input distribution signal IDST may be set to be less than the number of bits of the arithmetic result signal MOUT.

Figure 3:
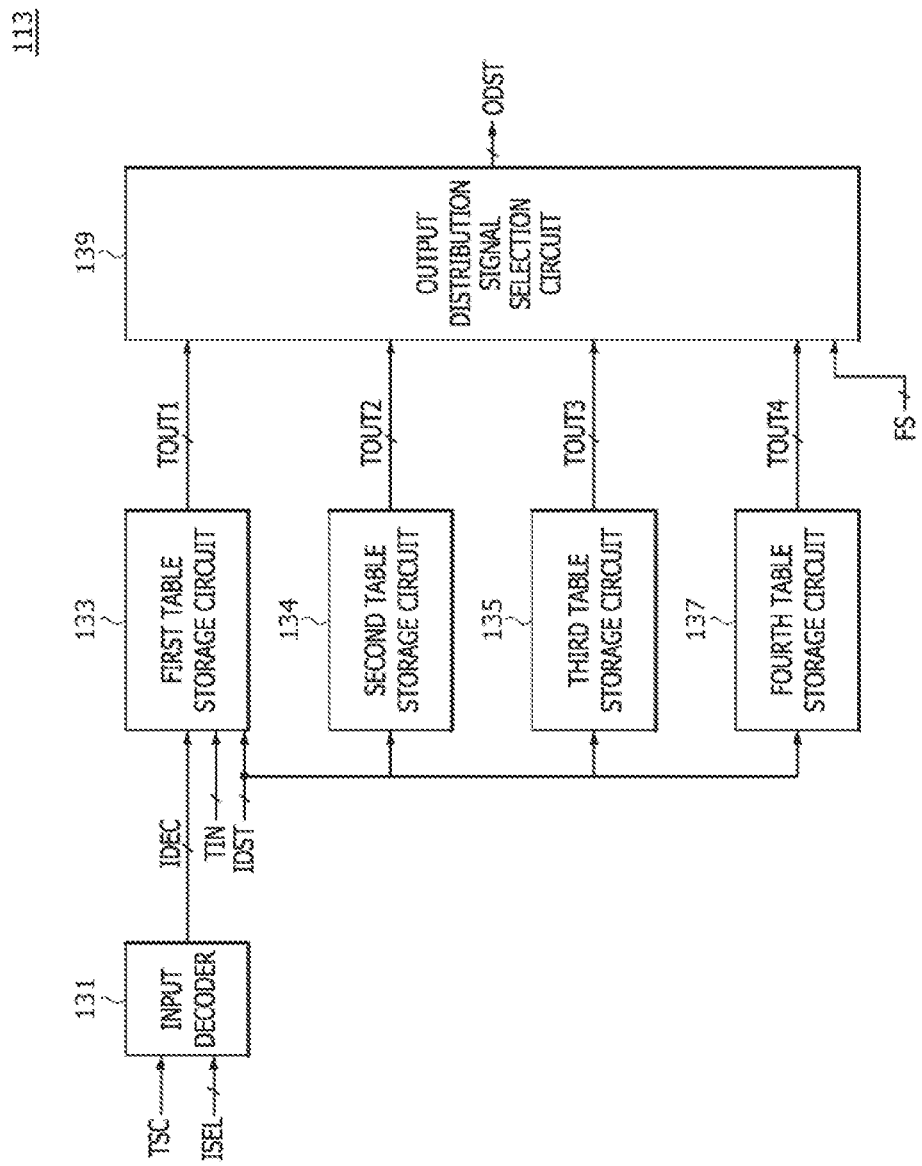
FIG. 3 is a block diagram illustrating a configuration of an AF circuit included in the arithmetic device of FIG. 1.

Referring to FIG. 3, the AF circuit 113 may include an input decoder 131, the first table storage circuit 133, a second table storage circuit 134, a third table storage circuit 135, a fourth table storage circuit 137, and an output distribution signal selection circuit 139.

The input decoder 131 may generate a decoded input signal IDEC based on the table set signal TSC and the input selection signal ISEL. The input decoder 131 may decode the input selection signal ISEL to generate the decoded input signal IDEC when the table set signal TSC is activated.

The first table storage circuit 133 may store the table input signal TIN and may output a first table output signal TOUT1, based on the decoded input signal IDEC and the input distribution signal IDST. The first table storage circuit 133 may store the table input signal TIN as a first activation function with a look-up table form based on the decoded input signal IDEC. The first table storage circuit 133 may output a result value of the first activation function as the first table output signal TOUT1 based on the input distribution signal IDST. A configuration and an operation of the first table storage circuit 133 will be described with reference to FIGS. 4 to 6.

A second activation function may be hardwired into the second table storage circuit 134. The second table storage circuit 134 may include logic circuits implemented in hardware with the second activation function. The second activation function may be set as one of sigmoid, Tanh, ReLU, leaky ReLU, and Maxout. The second table storage circuit 134 may output a result value of the second activation function that is stored in a look-up table form as a second table output signal TOUT2 based on the input distribution signal IDST. A configuration and an operation of the second table storage circuit 134 will be described with reference to FIG. 7.

A third activation function may be hardwired into the third table storage circuit 135. The third table storage circuit 135 may include logic circuits implemented in hardware with the third activation function. The third activation function may be set as one of sigmoid, Tanh, ReLU, leaky ReLU, and Maxout. The third activation function may be set to be different from the second activation function. The third table storage circuit 135 may output a result value of the third activation function that is stored in a look-up table form as a third table output signal TOUT3 based on the input distribution signal IDST.

A fourth activation function may be hardwired into the fourth table storage circuit 137. The fourth table storage circuit 137 may include logic circuits implemented in hardware with the fourth activation function. The fourth activation function may be set as one of sigmoid, Tanh, ReLU, leaky ReLU, and Maxout. The fourth activation function may be set to be different from the second and third activation functions. The fourth table storage circuit 137 may output a result value of the fourth activation function that is stored in a look-up table form as a fourth table output signal TOUT4 based on the input distribution signal IDST.

The output distribution signal selection circuit 139 may generate the output distribution signal ODST from the first table output signal TOUT1, the second table output signal TOUT2, the third table output signal TOUT3, and the fourth table output signal TOUT4 based on the function selection signal FS. The output distribution signal selection circuit 139 may output the first table output signal TOUT1 as the output distribution signal ODST when the function selection signal FS has a first logic level combination. The output distribution signal selection circuit 139 may output the second table output signal TOUT2 as the output distribution signal ODST when the function selection signal FS has a second logic level combination. The output distribution signal selection circuit 139 may output the third table output signal TOUT3 as the output distribution signal ODST when the function selection signal FS has a third logic level combination. The output distribution signal selection circuit 139 may output the fourth table output signal TOUT4 as the output distribution signal ODST when the function selection signal FS has a fourth logic level combination.

Figure 4:
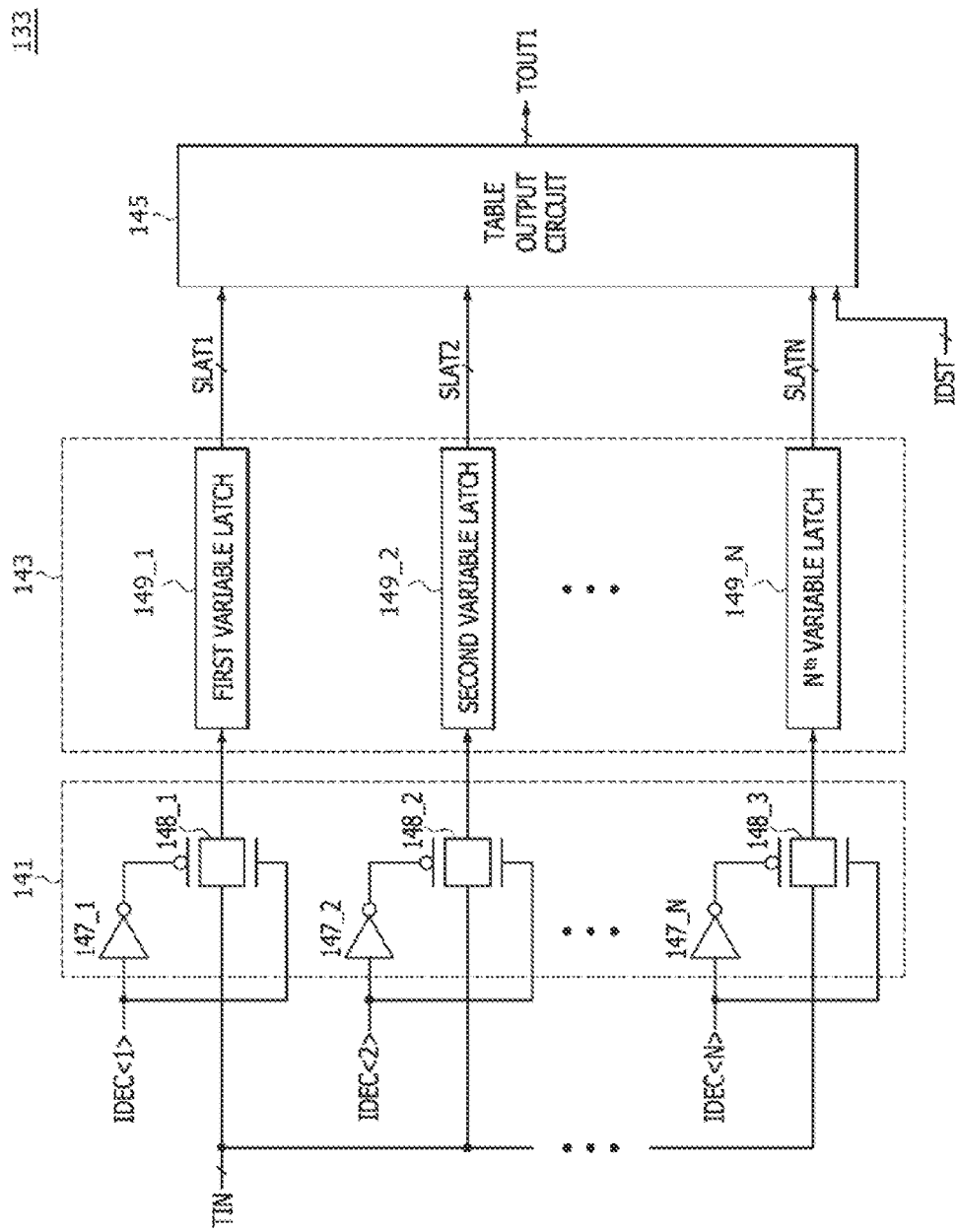
FIG. 4 illustrates a configuration of a first table storage circuit included in the AF circuit of FIG. 3.

Referring to FIG. 4, the first table storage circuit 133 may include a decoded signal input circuit 141, a variable latch circuit 143, and a table output circuit 145.

The decoded signal input circuit 141 may include inverters 147_1~147_N and transfer gates 148_1~148_N. The inverter 1471 may inversely buffer a first bit signal of the decoded input signal IDEC<1> to output the inversely buffered signal of the first bit signal of the decoded input signal IDEC<1>. The inverter 1472 may inversely buffer a second bit signal of the decoded input signal IDEC<2> to output the inversely buffered signal of the second bit signal of the decoded input signal IDEC<2>. The inverter 147_N may inversely buffer an $N^{th}$ bit signal of the decoded input signal IDEC<N> to output the inversely buffered signal of the $N^{th}$ bit signal of the decoded input signal IDEC<N>. The transfer gate 148_1 may be turned on to transfer the table input signal TIN to a first variable latch 149_1 when the first bit signal of the decoded input signal IDEC<1> has a logic "high" level. The transfer gate 148_2 may be turned on to transfer the table input signal TIN to a second variable latch 149_2 when the second bit signal of the decoded input signal IDEC<2> has a logic "high" level. The transfer gate 148_N may be turned on to transfer the table input signal TIN to an $N^{th}$ variable latch 149_N when the $N^{th}$ bit signal of the decoded input signal IDEC<N> has a logic "high" level.

The decoded signal input circuit 141 may transfer the table input signal TIN to the first to $N^{th}$ variable latches 149_1~149_N included in the variable latch circuit 143 based on the decoded input signal IDEC. The decoded signal input circuit 141 may receive the table input signal TIN through a path selected by the decoded input signal IDEC to transfer the table input signal TIN to the first to $N^{th}$ variable latches 149_1~149_N included in the variable latch circuit 143.

The variable latch circuit 143 may include the first to $N^{th}$ variable latches 149_1~149_N. The first variable latch 149_1 may receive and store the table input signal TIN through the transfer gate 148_1 turned on when the first bit signal IDEC<1> of the decoded input signal IDEC has a logic "high" level and may output the stored table input signal TIN as a first variable latch signal SLAT1. The second variable latch 149_2 may receive and store the table input signal TIN through the transfer gate 148_2 turned on when the second bit signal IDEC<2> of the decoded input signal IDEC has a logic "high" level and may output the stored table input signal TIN as a second variable latch signal SLAT2. The $N^{th}$ variable latch 149_N may receive and store the table input signal TIN through the transfer gate 148_N turned on when the $N^{th}$ bit signal IDEC<N> of the decoded input signal IDEC has a logic "high" level and may output the stored table input signal TIN as an $N^{th}$ variable latch signal SLATN.

The table output circuit 145 may select one of the first to $N^{th}$ variable latch signals SLAT1~SLATN as a result value of the activation function based on the input distribution signal IDST, thereby outputting the selected variable latch signal as the first table output signal TOUT1. The table output circuit 145 may be realized to select one of the first to $N^{th}$ variable latch signals SLAT1~SLATN as the first table output signal TOUT1 based on a logic level combination of the input distribution signal IDST or based on a decoded signal of the input distribution signal IDST. A configuration and an operation of the table output circuit 145 will be described with reference to FIGS. 5 and 6.

Figure 5:
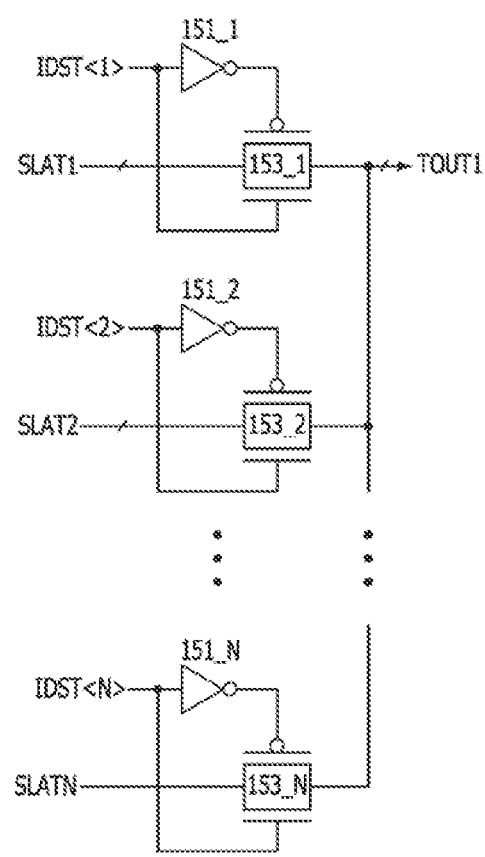
FIGS. 5 and 6 are circuit diagrams illustrating examples of a table output circuit included in the first table storage circuit of FIG. 4.

Referring to FIG. 5, a table output circuit 145a that corresponds to an example of the table output circuit 145 may include inverters 151_1, 151_2, . . . , and 151_N and transfer gates 1531, 153_2, . . . , and 153_N. The inverter 151_1 may inversely buffer a first bit signal of the input distribution signal IDST<1> to output the inversely buffered signal of the first bit signal of the input distribution signal IDST<1>. The inverter 151_2 may inversely buffer a second bit signal of the input distribution signal IDST<2> to output the inversely buffered signal of the second bit signal of the input distribution signal IDST<2>. The inverter 151_N may inversely buffer an $N^{th}$ bit signal of the input distribution signal IDST<N> to output the inversely buffered signal of the $N^{th}$ bit signal of the input distribution signal IDST<N>. The transfer gate 153_1 may be turned on to output the first variable latch signal SLAT1 as the first table output signal TOUT1 when the first bit signal of the input distribution signal IDST<1> has a logic "high" level. The transfer gate 153_2 may be turned on to output the second variable latch signal SLAT2 as the first table output signal TOUT1 when the second bit signal of the input distribution signal IDST<2> has a logic "high" level. The transfer gate 153_N may be turned on to output the N variable latch signal SLATN as the first table output signal TOUT1 when the $N^{th}$ bit signal of the input distribution signal IDST<N> has a logic "high" level.

Figure 6:
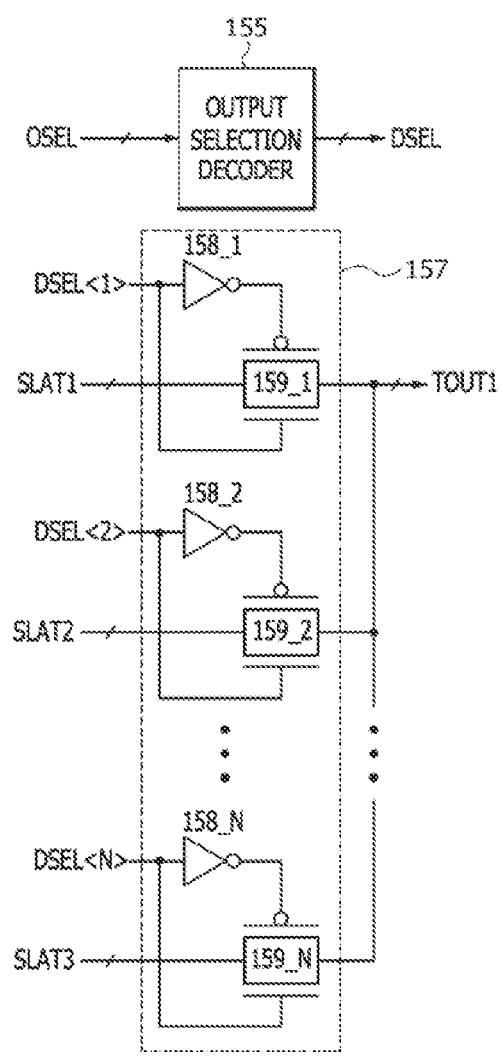

Referring to FIG. 6, a table output circuit 145b that corresponds to another example of the table output circuit 145 may include an output selection decoder 155 and a decoded signal output circuit 157. The output selection decoder 155 may decode the input distribution signal IDST to generate a decoded selection signal DSEL. The decoded signal output circuit 157 may include inverters 158_1, 158_2, . . . , and 158_N and transfer gates 159_1, 159_2, . . . , and 159_N. The inverter 158_1 may inversely buffer a first bit signal of the decoded selection signal DSEL<1> to output the inversely buffered signal of the first bit signal of the decoded selection signal DSEL<1>. The inverter 158_2 may inversely buffer a second bit signal of the decoded selection signal DSEL<2> to output the inversely buffered signal of the second bit signal of the decoded selection signal DSEL<2>. The inverter 158_N may inversely buffer an $N^{th}$ bit signal of the decoded selection signal DSEL<N> to output the inversely buffered signal of the $N^{th}$ bit signal of the decoded selection signal DSEL<N>. The transfer gate 159_1 may be turned on to output the first variable latch signal SLAT1 as the first table output signal TOUT1 when the first bit signal of the decoded selection signal DSEL<1> has a logic "high" level. The transfer gate 159_2 may be turned on to output the second variable latch signal SLAT2 as the first table output signal TOUT1 when the second bit signal of the decoded selection signal DSEL<2> has a logic "high" level. The transfer gate 159_N may be turned on to output the $N^{th}$ variable latch signal SLATN as the first table output signal TOUT1 when the $N^{th}$ bit signal of the decoded selection signal DSEL<N> has a logic "high" level.

Figure 7:
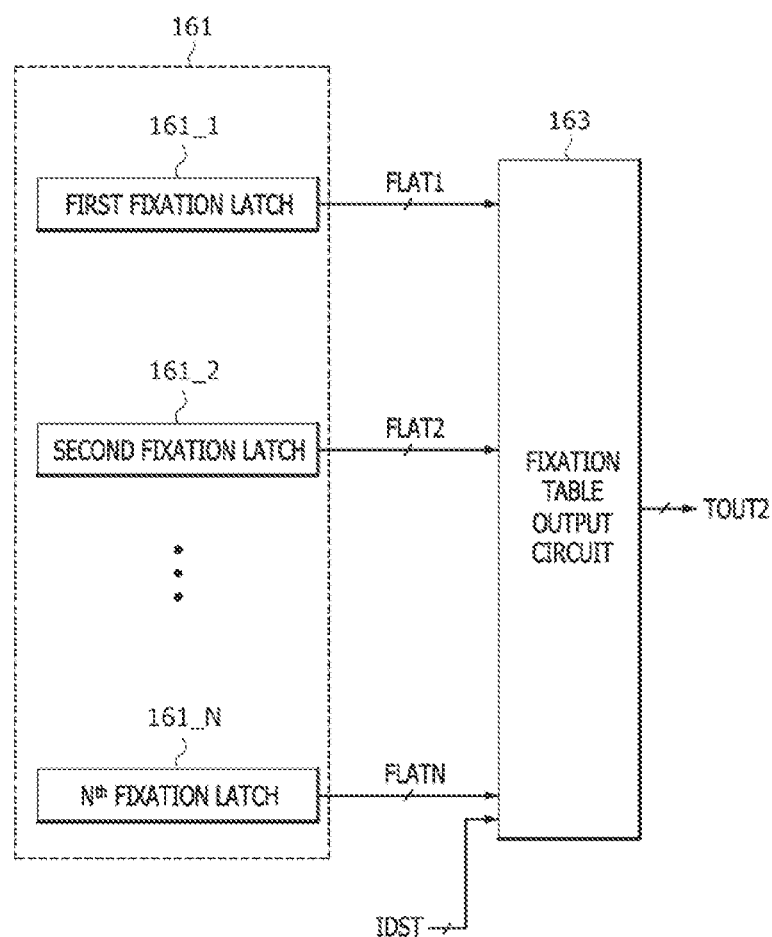
FIG. 7 is a block diagram illustrating a configuration of a second table storage circuit included in the AF circuit of FIG. 3.

Referring to FIG. 7, the second table storage circuit 134 may include a fixation latch circuit 161 and a fixation table output circuit 163. The fixation latch circuit 161 may include first to $N^{th}$ fixation latches 161_1~161_N. A first fixation latch signal FLAT1 may be hardwired in the first fixation latch 161_1 as a hardware. A second fixation latch signal FLAT2 may be hardwired in the second fixation latch 161_2 as a hardware. An $N^{th}$ fixation latch signal FLATN may be hardwired in the $N^{th}$ fixation latch 161_N as a hardware. Each of the first to $N^{th}$ fixation latch signals FLAT1~FLATN stored in the first to $N^{th}$ fixation latches 161_1~161_N may be a result value for storing one of sigmoid, Tanh, ReLU, leaky ReLU, and Maxout in a look-up table form. Logic level combinations of the input distribution signal IDST may be set to correspond to the first to $N^{th}$ fixation latch signals FLAT1~FLATN, respectively. The fixation table output circuit 163 may select one of the first to $N^{th}$ fixation latch signals FLAT1~FLATN as a result value of the activation function based on the input distribution signal IDST, thereby outputting the selected variable latch signal as the second table output signal TOUT2. Each of the third and fourth table storage circuits 25 and 26 illustrated in FIG. 3 may be realized to have the same configuration as the second table storage circuit 134 illustrated in FIG. 7.

The arithmetic device 100 with an aforementioned configuration may receive information regarding the activation function used for a neural network as a command and an address to store the information in a look-up table form. Thus, various activation functions set to be different from each other may be applied to the neural network without any design changes.

Figure 8:
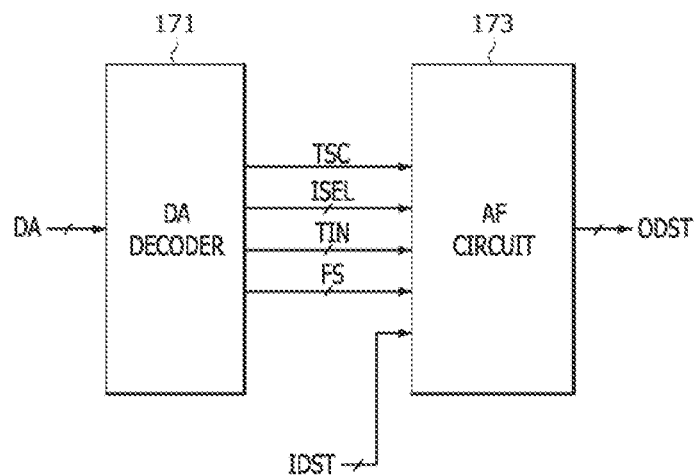
FIG. 8 is a block diagram illustrating a configuration of an arithmetic device according to another embodiment of the present disclosure.

Referring to FIG. 8, an arithmetic device 100a, according to another embodiment, may include an external data decoder 171 and an AF circuit 173.

The external data decoder 171 may receive external data DA to set and output a table set signal TSC, an input selection signal ISEL, a table input signal TIN, and a function selection signal FS. The external data decoder 171 may generate the table set signal TSC, the input selection signal ISEL, the table input signal TIN, and the function selection signal FS from the external data DA that are sequentially input to the external data decoder 171.

The AF circuit 173 may store activation functions used for a neural network in a look-up table form, based on the table set signal TSC, the input selection signal ISEL, and the table input signal TIN. Various activation functions may be hardwired in the AF circuit 173. The AF circuit 173 may output a result value of an activation function, which is selected by the function selection signal FS based on an input distribution signal IDST, as an output distribution signal ODST. A configuration and an operation of the AF circuit 173 may be the same as a configuration and an operation of the AF circuit 113 illustrated in FIG. 1. Thus, descriptions of the AF circuit 173 will be omitted hereinafter.

The arithmetic device 100a with the aforementioned configurations may receive information regarding the activation function used for a neural network as data to store the information in a look-up table form. Thus, various activation functions set to be different from each other may be applied to the neural network without any design changes.

Figure 9:
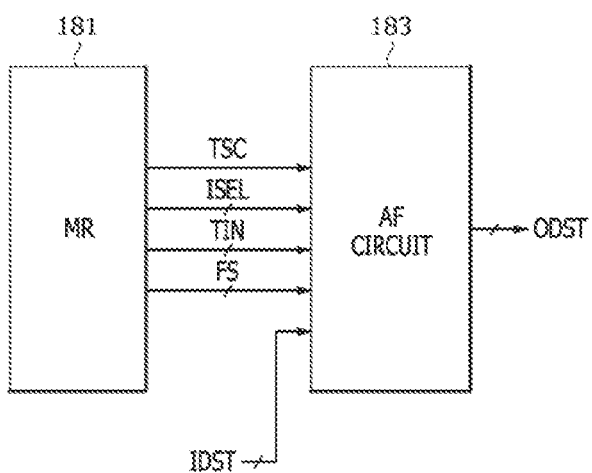
FIG. 9 is a block diagram illustrating a configuration of an arithmetic device according to still another embodiment of the present disclosure.

Referring to FIG. 9, an arithmetic device 100b, according to still another embodiment, may include a mode register 181 and an AF circuit 183.

The mode register 181 may store a table set signal TSC, an input selection signal ISEL, a table input signal TIN, and a function selection signal FS through a mode register set. The mode register 181 may output the table set signal TSC, the input selection signal ISEL, the table input signal TIN, and the function selection signal FS through a mode register read.

The AF circuit 183 may store activation functions used for a neural network in a look-up table form, based on the table set signal TSC, the input selection signal ISEL, and the table input signal TIN. Various activation functions may be hardwired in the AF circuit 183. The AF circuit 183 may output a result value of an activation function, which is selected by the function selection signal FS based on an input distribution signal IDST, as an output distribution signal ODST. A configuration and an operation of the AF circuit 183 may be the same as a configuration and an operation of the AF circuit 113 illustrated in FIG. 1. Thus, descriptions of the AF circuit 183 will be omitted hereinafter.

The arithmetic device 100b with the aforementioned configurations may store information regarding the activation function used for a neural network in a look-up table form based on information stored in the mode register 181. Thus, various activation functions set to be different from each other may be applied to the neural network without any design changes.

The arithmetic device 100 illustrated in FIG. 1, the arithmetic device 100a illustrated in FIG. 8, and the arithmetic device 100b illustrated in FIG. 9 can be included in memory modules that receive the external command through hosts and memory controllers. Memory modules can be implemented as single in-line memory module (SIMM), dual inline memory module (DIMM), and high bandwidth memory (HBM).

Figure 10:
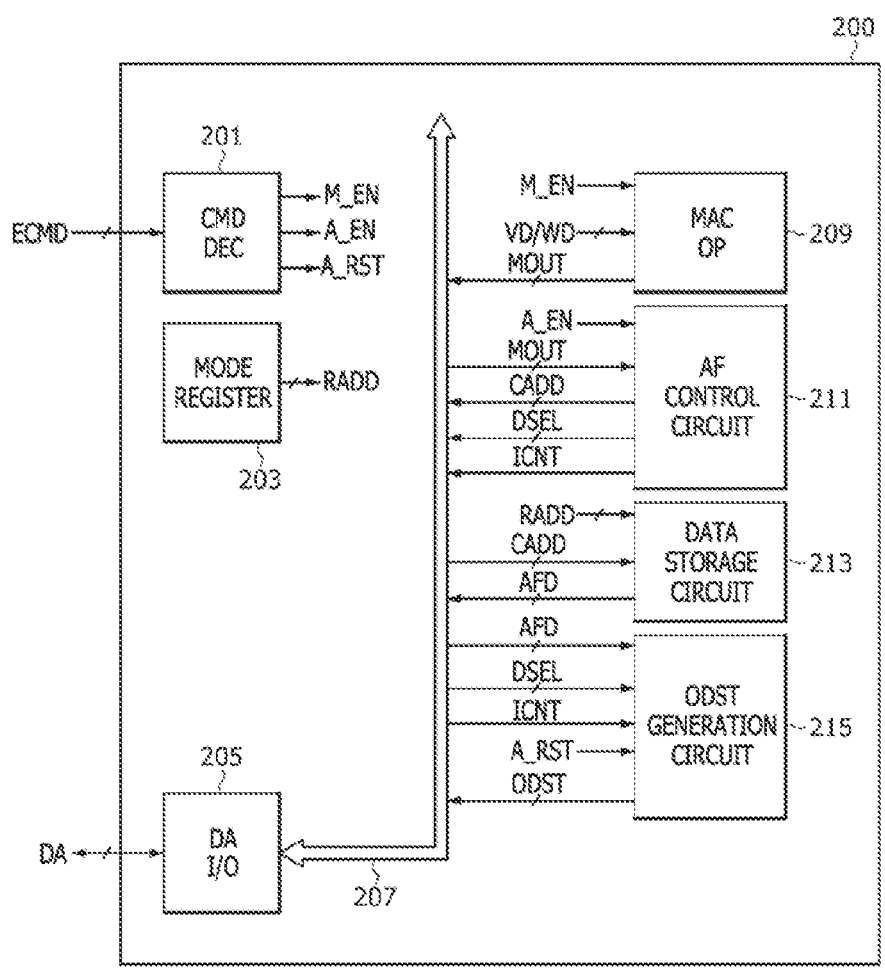
FIG. 10 is a block diagram illustrating a configuration of an arithmetic device according to yet another embodiment of the present disclosure.

As illustrated in FIG. 10, an arithmetic device 200, according to yet another embodiment, may include a command decoder (CMD DEC) 201, a mode register 203, a data input/output (I/O) circuit 205, a data line 207, a MAC operator 209, an AF control circuit 211, a data storage circuit 213, and an output distribution signal generation circuit 215.

The command decoder 201 may receive an external command ECMD from an external device that is coupled to the arithmetic device 200. The external device may be a host, a controller, or a test apparatus. The command decoder 201 may decode the external command ECMD to generate an arithmetic control signal M_EN, an activation control signal A_EN, and an activation reset signal A_RST. The arithmetic control signal M_EN may be activated to perform a MAC arithmetic operation for vector data VD and weight data WD. The activation control signal A_EN may be activated to control an activation operation to output activation data AFD from the data storage circuit 213 based on an arithmetic result signal MOUT that is generated by the MAC arithmetic operation. The activation reset signal A_RST may be activated to perform an operation to generate an output distribution signal ODST from the activation data AFD.

The mode register 203 may apply a row address RADD to the data storage circuit 213. The mode register 203 may extract the row address RADD from an external address (not shown) received from the external device that is coupled to the arithmetic device 200 and may store the row address RADD, when a mode register set operation is performed.

The data I/O circuit 205 may receive external data DA from the external device that is coupled to the arithmetic device 200 and may transmit the external data DA to at least one of the MAC operator 209 and the data storage circuit 213 through the data line 207. The data I/O circuit 205 may output data that is output from at least one of the MAC operator 209, the data storage circuit 213, and the output distribution signal generation circuit 215 through the data line 207 as the external data DA. The data I/O circuit 205 may include a data I/O buffer, a data input driver, a data output driver, a deserializer, and so forth to perform an operation for receiving or outputting the external data DA.

The MAC operator 209 may receive the arithmetic control signal M_EN from the command decoder 201. The MAC operator 209 may perform the MAC arithmetic operation for the vector data VD and the weight data WD based on the arithmetic control signal M_EN to generate an arithmetic result signal MOUT. The MAC operator 209 may perform a multiplication calculation and an accumulation calculation for the vector data VD and the weight data WD to generate the arithmetic result signal MOUT during the MAC arithmetic operation. The MAC operator 209 may receive the output distribution signal ODST that is output from the output distribution signal generation circuit 215 as the vector data VD in perceptron to which multiple layers are applied.

The AF circuit 211 may receive the activation control signal A_EN from the command decoder 201. The AF circuit 211 may receive the arithmetic result signal MOUT from the MAC operator 209. The AF circuit 211 may generate a column address CADD, a data selection signal DSEL, and an internal control signal ICNT based on the activation control signal A_EN and the arithmetic result signal MOUT.

The data storage circuit 213 may receive the row address RADD from the mode register 203. The data storage circuit 213 may receive the column address CADD from the AF control circuit 211. The data storage circuit 213 may include multiple memory cell arrays. Various activation functions may be stored in the multiple memory cell arrays that are included in the data storage circuit 213. One of the multiple memory cell arrays that is included in the data storage circuit 213 may be selected by the row address RADD and the column address CADD. The data storage circuit 213 may output an activation function that is stored in one memory cell array, which is selected by the row address RADD and the column address CADD, as the activation data AFD.

The output distribution signal generation circuit 215 may receive the activation data AFD from the data storage circuit 213. The output distribution signal generation circuit 215 may receive the data selection signal DSEL and the internal control signal ICNT from the AF circuit 211. The output distribution signal generation circuit 215 may receive the activation reset signal A_RST from the command decoder 201. The output distribution signal generation circuit 215 may generate the output distribution signal ODST based on the activation data AFD, the data selection signal DSEL, the internal control signal ICNT, and the activation reset signal A_RST.

Figure 11:
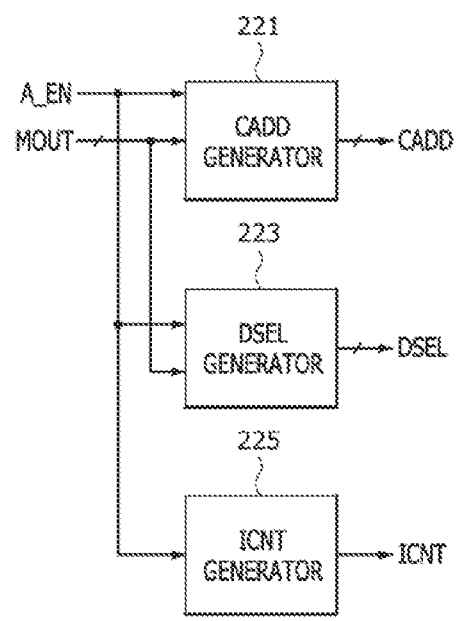
FIG. 11 is a block diagram illustrating a configuration of an AF control circuit included in the arithmetic device illustrated in FIG. 10.

As illustrated in FIG. 11, the AF circuit 211 may include a column address generator 221, a data selection signal generator 223, and an internal control signal generator 225.

The column address generator 221 may generate the column address CADD based on the activation control signal A_EN and the arithmetic result signal MOUT. The column address generator 221 may generate the column address CADD with bits, a logic level combination of which is set based on a logic level combination of bits that is included in the arithmetic result signal MOUT while the activation control signal A_EN is activated. The number of bits that are included in the arithmetic result signal MOUT that is input to the column address generator 221 may be set to be different according to the embodiments. The number of bits that are included in the column address CADD that is generated by the column address generator 221 may be set to be different according to the embodiments. The column address CADD may include a signal that selects a bank and signals that select bit lines.

The data selection signal generator 223 may generate the data selection signal DSEL based on the activation control signal A_EN and the arithmetic result signal MOUT. The data selection signal generator 223 may generate the data selection signal DSEL with bits, a logic level combination of which is set based on a logic level combination of bits that are included in the arithmetic result signal MOUT while the activation control signal A_EN is activated. The number of bits that are included in the arithmetic result signal MOUT that is input to the data selection signal generator 223 may be set to be different according to the embodiments. The number of bits that are included in the data selection signal DSEL that is generated by the data selection signal generator 223 may be set to be different according to the embodiments.

The internal control signal generator 225 may generate the internal control signal ICNT based on the activation control signal A_EN. The internal control signal generator 225 may generate the internal control signal ICNT that is activated when the activation control signal A_EN is activated. A logic level of the activated internal control signal ICNT may be set to be different according to the embodiments.

Figure 12:
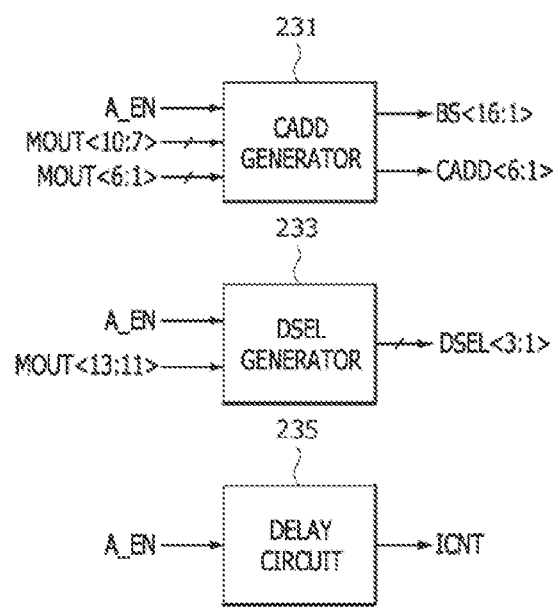
FIG. 12 is a block diagram illustrating a configuration of another example of the AF control circuit illustrated in FIG. 11.

FIG. 12 is a block diagram illustrating a configuration of an AF control circuit 211A that corresponds to another example of the AF control circuit 211 illustrated in FIG. 11. As illustrated in FIG. 12, the AF control circuit 211A may include a column address generator 231, a data selection signal generator 233, and a delay circuit 235.

The column address generator 231 may generate first to sixteenth bits BS<16:1> of a bank selection signal BS and first to sixth bits CADD<6:1> of the column address CADD based on the activation control signal A_EN, seventh to tenth bits MOUT<10:7> of the arithmetic result signal MOUT, and first to sixth bits MOUT<6:1> of the arithmetic result signal MOUT. The column address generator 231 may decode the seventh to tenth bits MOUT<10:7> of the arithmetic result signal MOUT to generate the first to sixteenth bits BS<16:1> of the bank selection signal BS while the activation control signal A_EN is activated. The column address generator 231 may generate the first to sixth bits CADD<6:1> of the column address CADD, a logic level combination of which is determined based on a logic level combination of the first to sixth bits MOUT<6:1> of the arithmetic result signal MOUT while the activation control signal A_EN is activated.

The data selection signal generator 233 may generate first to third bits DSEL<3:1> of the data selection signal DSEL based on the activation control signal A_EN and eleventh to thirteenth bits MOUT<13:11> of the arithmetic result signal MOUT. The data selection signal generator 233 may generate the first to third bits DSEL<3:1> of the data selection signal DSEL, a logic level combination of which is set based on a logic level combination of the eleventh to thirteenth bits MOUT<13:11> of the arithmetic result signal MOUT while the activation control signal A_EN is activated. The data selection signal generator 233 may buffer the eleventh to thirteenth bits MOUT<13:11> of the arithmetic result signal MOUT to generate the first to third bits DSEL<3:1> of the data selection signal DSEL when the activation control signal A_EN is activated.

The delay circuit 235 may generate the internal control signal ICNT based on the activation control signal A_EN. The delay circuit 235 may delay the activation control signal A_EN to generate and output the internal control signal ICNT. The delay circuit 235 may generate the internal control signal ICNT, which is activated when a predetermined delay period elapses after the activation control signal A_EN is activated.

Figure 13:
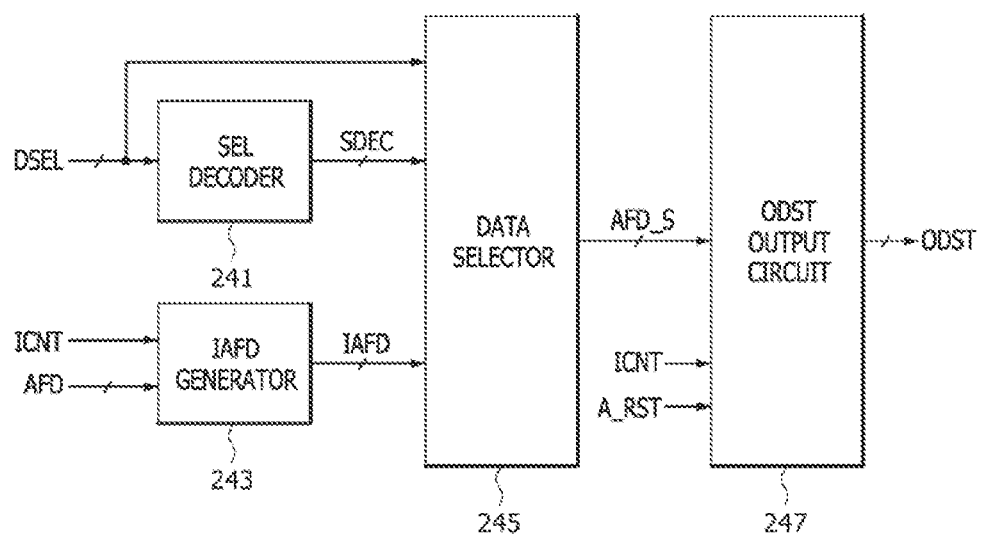
FIG. 13 is a block diagram illustrating a configuration of an output distribution signal generation circuit included in the arithmetic device illustrated in FIG. 10.

As illustrated in FIG. 13, the output distribution signal generation circuit 215 may include a selection signal decoder 241, an internal activation data generator 243, a data selector 245, and an output distribution signal output circuit 247.

The selection signal decoder 241 may generate a selection decoded signal SDEC based on the data selection signal DSEL. The selection signal decoder 241 may decode the data selection signal DSEL to generate the selection decoded signal SDEC.

The internal activation data generator 243 may generate internal activation data IAFD based on the internal control signal ICNT and the activation data AFD. The internal activation data generator 243 may buffer the activation data AFD to generate the internal activation data IAFD when the internal control signal ICNT is activated.

The data selector 245 may receive the selection decoded signal SDEC from the selection signal decoder 241. The data selector 245 may receive the internal activation data IAFD from the internal activation data generator 243. The data selector 245 may select a portion of bits that are included in the internal activation data IAFD based on the selection decoded signal SDEC and the data selection signal DSEL to output the selected portion of the bits that is included in the internal activation data IAFD as selected activation data AFD_S.

The output distribution signal output circuit 247 may receive the selected activation data AFD_S from the data selector 245. The output distribution signal output circuit 247 may generate the output distribution signal ODST from the selected activation data AFD_S based on the internal control signal ICNT and the activation reset signal A_RST.

Figure 14:
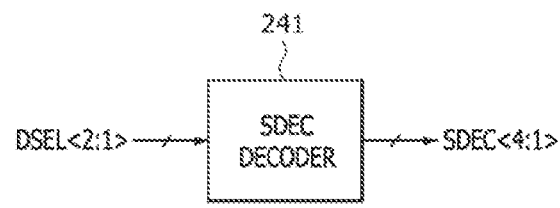
FIG. 14 is a block diagram illustrating a configuration of a selection signal decoder included in the output distribution signal generation circuit illustrated in FIG. 13.

Referring to FIG. 14, the selection signal decoder 241 may generate first to fourth bits SDEC<4:1> of the selection decoded signal SDEC based on first and second bits DSEL<2:1> of the data selection signal DSEL. The selection signal decoder 241 may decode the first and second bits DSEL<2:1> of the data selection signal DSEL to generate the first to fourth bits SDEC<4:1> of the selection decoded signal SDEC.

Figure 15:
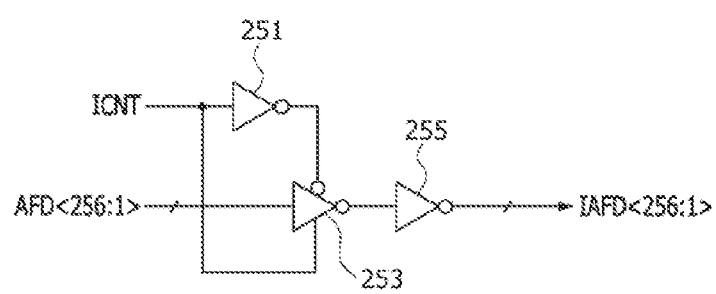
FIG. 15 is a circuit diagram illustrating a configuration of an internal activation data generator included in the output distribution signal generation circuit illustrated in FIG. 13.

As illustrated in FIG. 15, the internal activation data generator 243 may include inverters 251, 253, and 255. The inverter 251 may inversely buffer the internal control signal ICNT to output the inversely buffered signal of the internal control signal ICNT. The inverter 253 may inversely buffer first to $256^{th}$ bits AFD<156:1> of the activation data AFD to output the inversely buffered data of the first to $256^{th}$ bits AFD<156:1> of the activation data AFD when the internal control signal ICNT is activated to have a logic "high" level. The inverter 255 may inversely buffer an output signal of the inverter 253 to generate first to $256^{th}$ bits IAFD<256:1> of the internal activation data IAFD.

Figure 16:
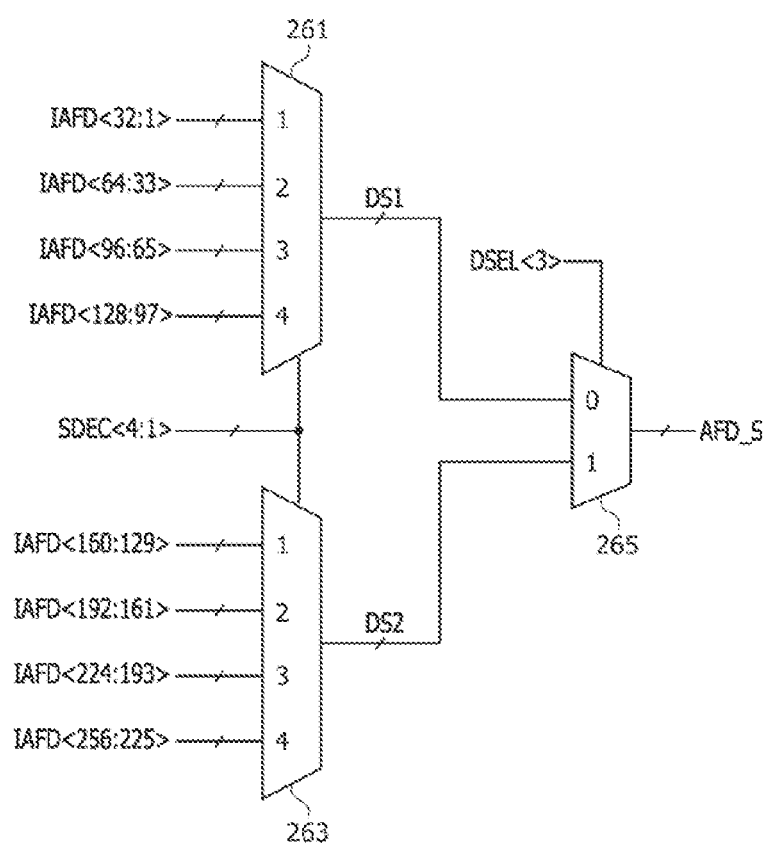
FIG. 16 is a circuit diagram illustrating a configuration of a data selector included in the output distribution signal generation circuit illustrated in FIG. 13.

As illustrated in FIG. 16, the data selector 245 may include a first selection data generator 261, a second selection data generator 263, and a selection output circuit 265.

The first selection data generator 261 may output the first to $32^{nd}$ bits IAFD<32:1> of the internal activation data IAFD, the $33^{rd}$ to $64^{th}$ bits IAFD<64:33> of the internal activation data IAFD, the 65th to $96^{th}$ bits IAFD<96:65> of the internal activation data IAFD, or the $97^{th}$ to $128^{th}$ bits IAFD<128:97> of the internal activation data IAFD as first selection data DS1 based on the first to fourth bits SDEC<4:1> of the selection decoded signal SDEC. For example, the first selection data generator 261 may output the first to $32^{nd}$ bits IAFD<32:1> of the internal activation data IAFD as the first selection data DS1 when the first bit SDEC<1> of the selection decoded signal SDEC is activated to have a logic "high" level and may output the $33^{rd}$ to $64^{th}$ bits IAFD<64:33> of the internal activation data IAFD as the first selection data DS1 when the second bit SDEC<2> of the selection decoded signal SDEC is activated to have a logic "high" level. Similarly, the first selection data generator 261 may output the $65^{th}$ to $96^{th}$ bits IAFD<96:65> of the internal activation data IAFD as the first selection data DS1 when the third bit SDEC<3> of the selection decoded signal SDEC is activated to have a logic "high" level and may output the $97^{th}$ to $128^{th}$ bits IAFD<128:97> of the internal activation data IAFD as the first selection data DS1 when the fourth bit SDEC<4> of the selection decoded signal SDEC is activated to have a logic "high" level.

The second selection data generator 263 may output the $129^{th}$ to 160 bits IAFD<160:129> of the internal activation data IAFD, the $161^{st}$ to $192^{nd}$ bits IAFD<192:161> of the internal activation data IAFD, the $193^{rd}$ to $224^{th}$ bits IAFD<224:193> of the internal activation data IAFD, or the $225^{th}$ to $256^{th}$ bits IAFD<256:225> of the internal activation data IAFD as second selection data DS2 based on the first to fourth bits SDEC<4:1> of the selection decoded signal SDEC. For example, the second selection data generator 263 may output the $129^{th}$ to $160^{th}$ bits IAFD<160:129> of the internal activation data IAFD as the second selection data DS2 when the first bit SDEC<1> of the selection decoded signal SDEC is activated to have a logic "high" level and may output the $161^{st}$ to $192^{nd}$ bits IAFD<192:161> of the Internal activation data IAFD as the second selection data DS2 when the second bit SDEC<2> of the selection decoded signal SDEC is activated to have a logic "high" level. Similarly, the second selection data generator 263 may output the $193^{rd}$ to $224^{th}$ bits IAFD<224:193> of the internal activation data IAFD as the second selection data DS2 when the third bit SDEC<3> of the selection decoded signal SDEC is activated to have a logic "high" level and may output the $225^{th}$ to $256^{th}$ bits IAFD<256:225> of the Internal activation data IAFD as the second selection data DS2 when the fourth bit SDEC<4> of the selection decoded signal SDEC is activated to have a logic "high" level.

The selection output circuit 265 may output the first selection data DS1 or the second selection data DS2 as the selected activation data AFD_S based on the third bit DSEL<3> of the data selection signal DSEL. For example, the selection output circuit 265 may output the first selection data DS1 as the selected activation data AFD_S when the third bit DSEL<3> of the data selection signal DSEL has a logic "low" level and may output the second selection data DS2 as the selected activation data AFD_S when the third bit DSEL<3> of the data selection signal DSEL has a logic "high" level.

Figure 17:
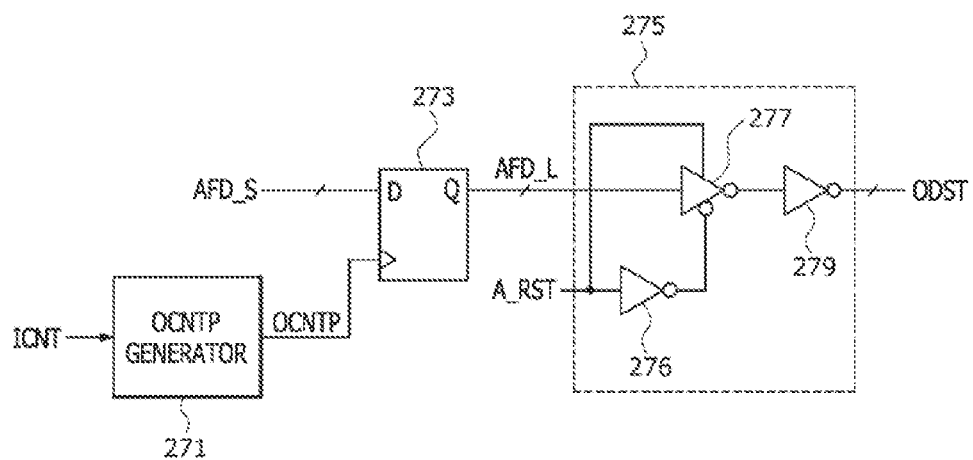
FIG. 17 illustrates a configuration of an output distribution signal output circuit included in the output distribution signal generation circuit illustrated in FIG. 13.

As illustrated in FIG. 17, the output distribution signal output circuit 247 may include an output control pulse generator 271, an activation data latch 273, and an output buffer circuit 275.

The output control pulse generator 271 may generate an output control pulse OCNTP based on the internal control signal ICNT. The output control pulse generator 271 may generate the output control pulse OCNTP when an output delay period elapses after the Internal control signal ICNT Is activated.

The activation data latch 273 may receive the output control pulse OCNTP from the output control pulse generator 271. The activation data latch 273 may generate latched activation data AFD_L based on the output control pulse OCNTP and the selected activation data AFD_S. The activation data latch 273 may latch the selected activation data AFD_S to output the latched data of the selected activation data AFD_S as the latched activation data AFD_L when the output control pulse OCNTP has a logic "high" level.

The output buffer circuit 275 may include inverters 276, 277, and 279. The inverter 276 may inversely buffer the activation reset signal A_RST to output the inversely buffered signal of the activation reset signal A_RST. The inverter 277 may inversely buffer the latched activation data AFD_L to output the Inversely buffered data of the latched activation data AFD_L when the activation reset signal A_RST is activated to have a logic "high" level. The inverter 279 may inversely buffer an output signal of the inverter 277 to generate and output the output distribution signal ODST. The output buffer circuit 275 may buffer the latched activation data AFD_L to output the buffered data of the latched activation data AFD_L as the output distribution signal ODST when the activation reset signal A_RST is activated to have a logic "high" level.

An operation of the arithmetic device 200 will be described hereinafter with reference to FIGS. 18 to 25.

Figure 18:
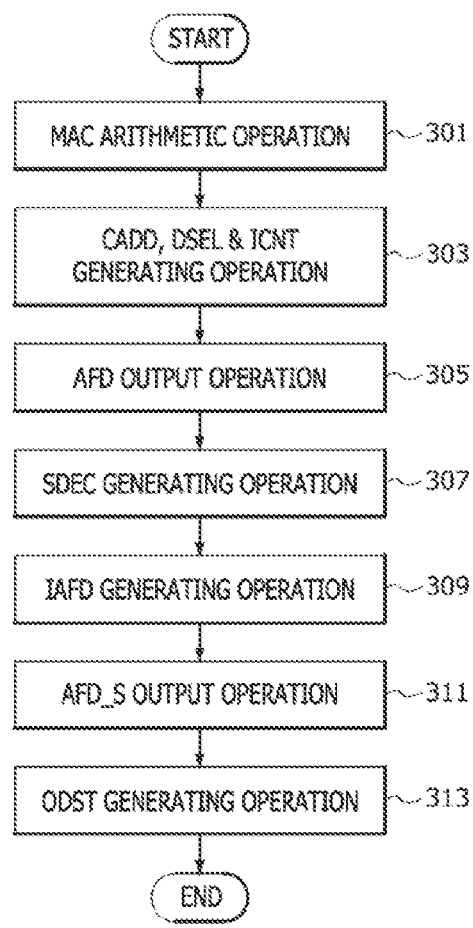
FIGS. 18 to 25 illustrate an operation of the arithmetic device illustrated in FIG. 10.
Figure 19:
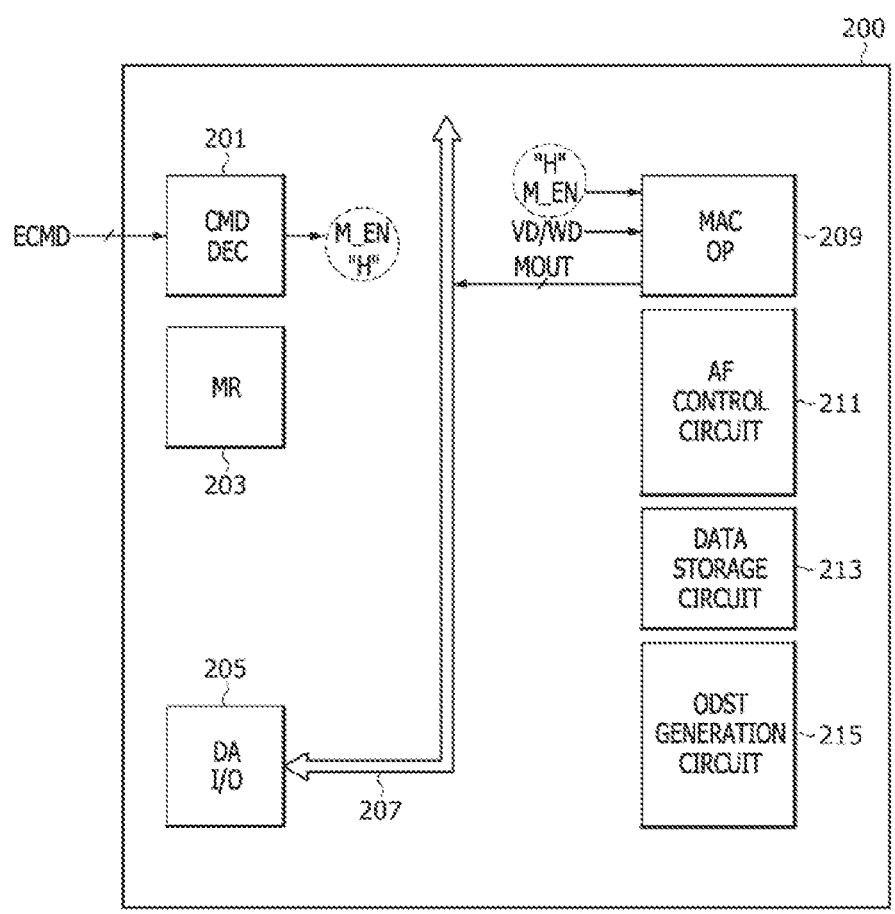

First, as illustrated in FIGS. 18 and 19, the MAC arithmetic operation may be performed when the arithmetic control signal M_EN that is generated by decoding the external command ECMD in the command decoder 201 is activated to have a logic "high" level (see a step 301). The MAC operator 209 may generate the arithmetic result signal MOUT by performing the MAC arithmetic operation for the vector data VD and the weight data WD.

Figure 20:
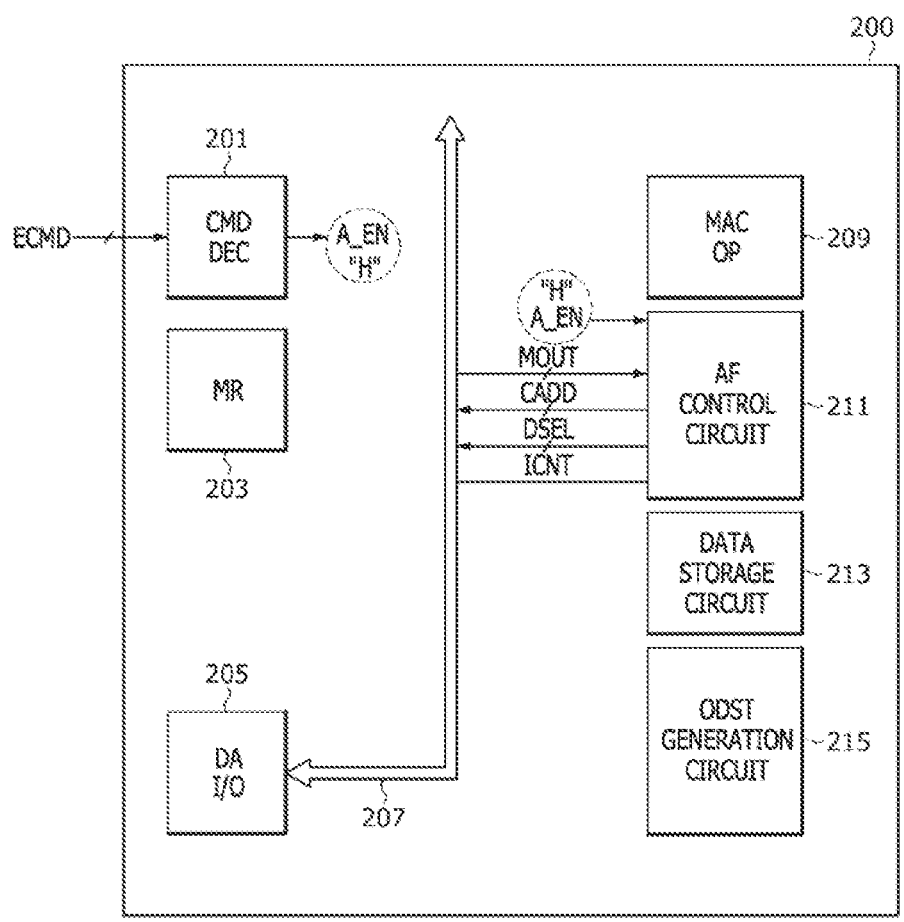

Next, as illustrated in FIGS. 18 and 20, an operation to generate the column address CADD, the data selection signal DSEL, and the internal control signal ICNT may be performed when the activation control signal A_EN that is generated by decoding the external command ECMD in the command decoder 201 is activated to have a logic "high" level (see a step 303). The AF control circuit 211 may generate the column address CADD, the data selection signal DSEL, and the internal control signal ICNT based on the arithmetic result signal MOUT.

Figure 21:
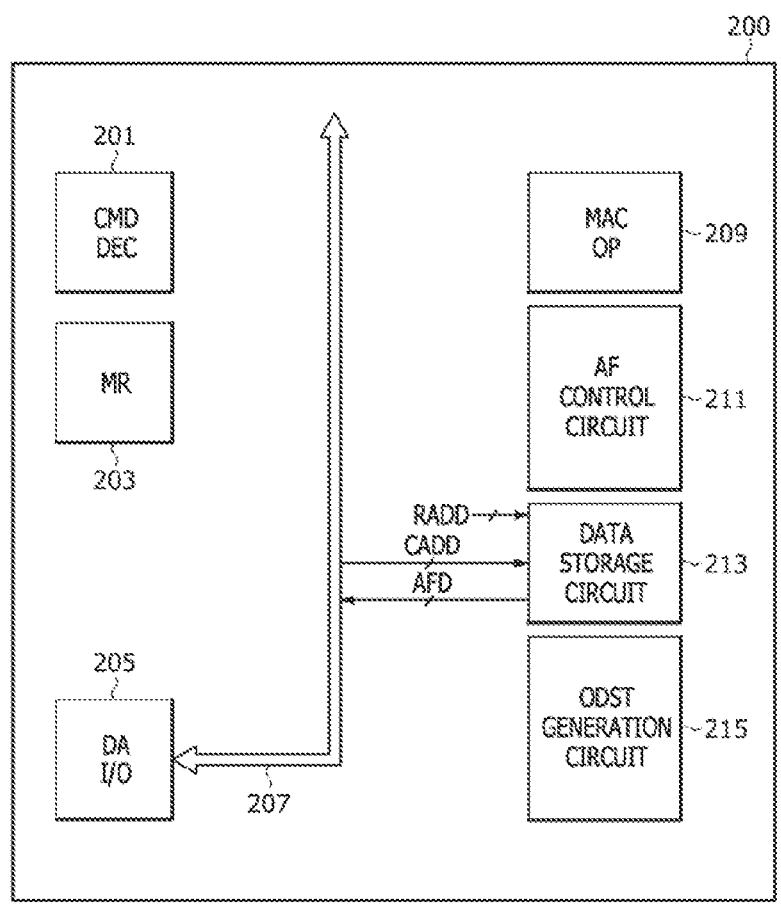

Next, as illustrated in FIGS. 18 and 21, an operation of the data storage circuit 213 may be performed to output the activation function that is stored in a memory cell array, which is selected by the row address RADD and the column address CADD, as the activation data AFD (see a step 305).

Figure 22:
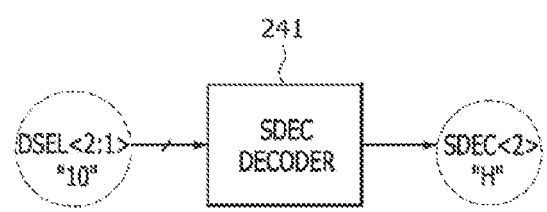

Next, as illustrated in FIGS. 18 and 22, an operation of the selection signal decoder 241 may be performed to decode the data selection signal DSEL and to generate the selection decoded signal SDEC (see a step 307). For example, the selection signal decoder 241 may enable only the second bit SDEC<2> among the first to fourth bits SDEC<4:1> of the selection decoded signal SDEC to a logic "high(H)" level when the first and second bits DSEL<2:1> of the data selection signal DSEL that is input to the selection signal decoder 241 have a logic level combination of '10'. In the first and second bits DSEL<2:1> of the data selection signal DSEL, the logic level combination of '10' means that the second bit DSEL<2> of the data selection signal DSEL has a logic "high" level and the first, third, and fourth bits DSEL<1> and DSEL<4:3> of the data selection signal DSEL have a logic "low" level.

Figure 23:
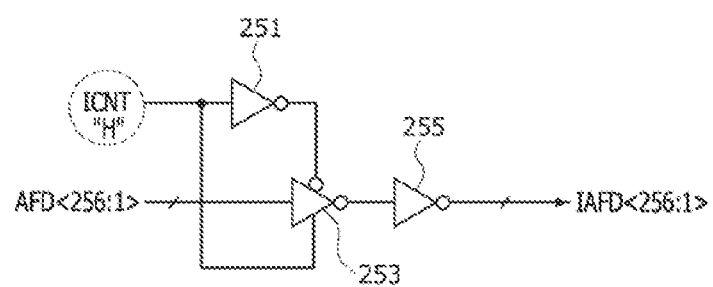

Next, as illustrated in FIGS. 18 and 23, the internal activation data generator 243 may perform an operation to generate the internal activation data IAFD by buffering the activation data AFD when the internal control signal ICNT is activated (see a step 309). For example, when the internal control signal ICNT is activated to have a logic "high(H)" level, the internal activation data generator 243 may buffer the first to 256$^{th}$ bits AFD<256:1> of the activation data AFD to output the buffered data of the first to 256$^{th}$ bits AFD<256:1> of the activation data AFD as the first to 256$^{th}$ bits IAFD<256:1> of the internal activation data IAFD.

Figure 24:
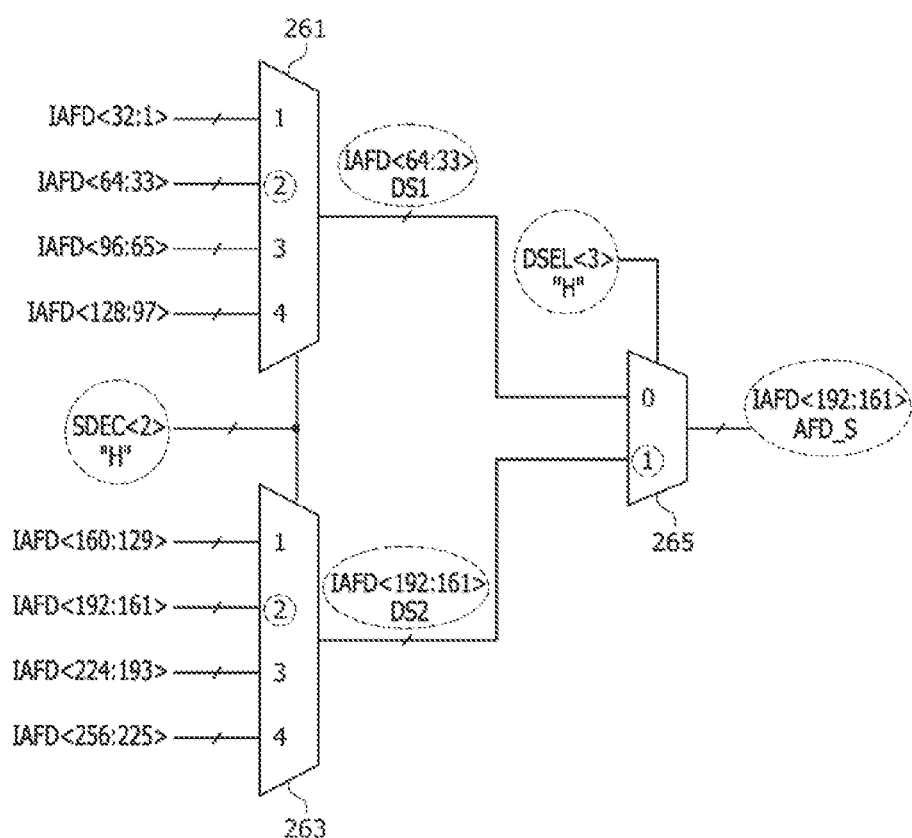

Next, as illustrated in FIGS. 18 and 24, the data selector 245 may perform an operation that selects a portion of bits that are included in the internal activation data IAFD based on the selection decoded signal SDEC and the data selection signal DSEL to output the selected portion of the bits that are included in the internal activation data IAFD as the selected activation data AFD_S (see a step 311). For example, when the second bit SDEC<2> of the selection decoded signal SDEC is activated to have a logic "high(H)" level, the first selection data generator 261 may output the 33$^{rd}$ to 64$^{th}$ bits IAFD<64:33> of the internal activation data IAFD as the first selection data DS1 and the second selection data generator 263 may output the 161$^{st}$ to 192$^{nd}$ bits IAFD<192:161> of the internal activation data IAFD as the second selection data DS2. In addition, when the third bit DSEL<3> of the data selection signal DSEL has a logic "high(H)" level, the selection output circuit 265 may output the 161$^{st}$ to 192$^{nd}$ bits IAFD<192:161> of the internal activation data IAFD that corresponds to second selection data DS2 as the selected activation data AFD_S.

Figure 25:
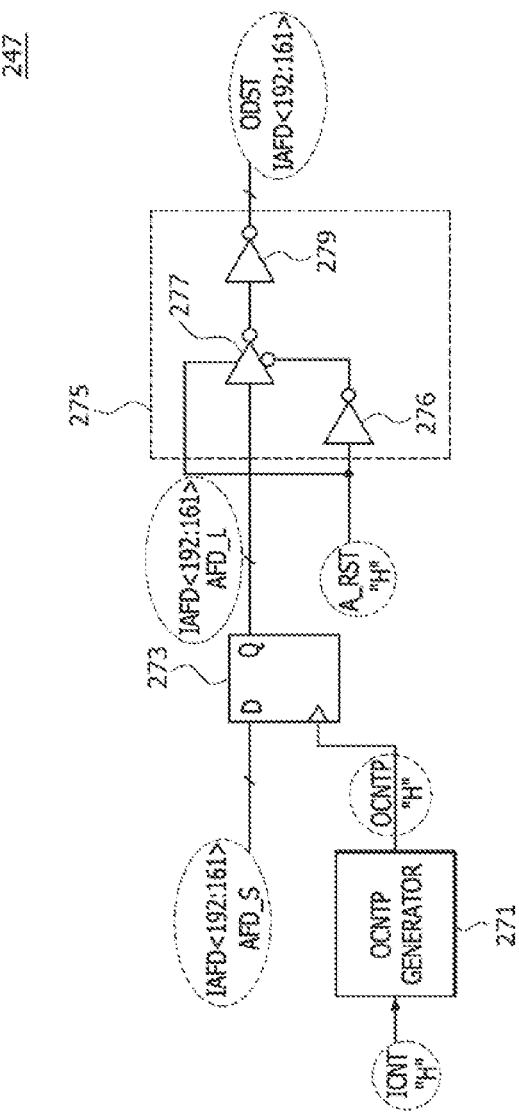

Next, as illustrated in FIGS. 18 and 25, the output distribution signal output circuit 247 may perform an operation to generate the output distribution signal ODST from the selected activation data AFD_S based on the internal control signal ICNT and the activation reset signal A_RST (see a step 313). For example, the output control pulse generator 271 may generate the output control pulse OCNTP with a logic "high" level when an output delay period elapses after the internal control signal ICNT is activated to have a logic "high(H)" level, and the activation data latch 273 may latch the selected activation data AFD_S to output the latched data of the selected activation data AFD_S as the latched activation data AFD_L. In addition, when the activation reset signal A_RST is activated to have a logic "high" level, the latched activation data AFD_L may be buffered to generate the output distribution signal ODST.

As described above, the arithmetic device 200, according to an embodiment, may output the activation data AFD from the data storage circuit 213 based on the arithmetic result signal MOUT that is generated by the MAC arithmetic operation and may extract the output distribution signal ODST from the activation data AFD to more readily perform an operation that applies an activation function to the arithmetic result signal MOUT.

Figure 26:
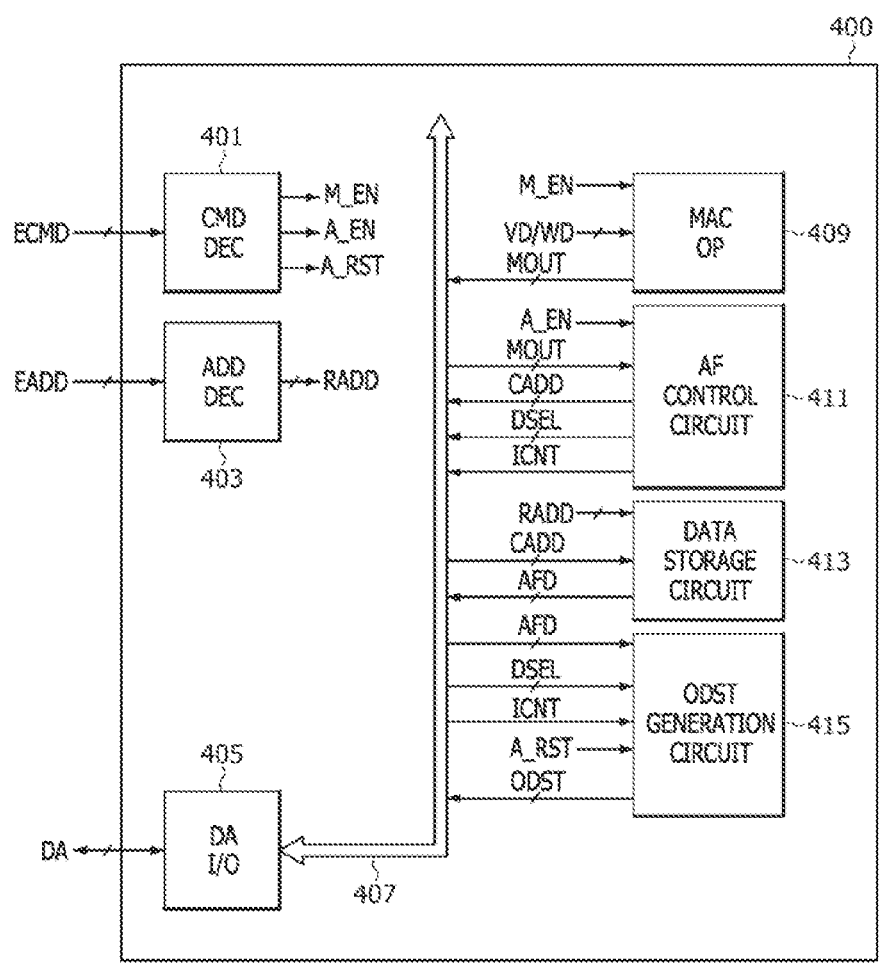
FIG. 26 is a block diagram illustrating a configuration of an arithmetic device according to yet still another embodiment of the present disclosure.

As illustrated in FIG. 26, an arithmetic device 400, according to yet another embodiment, may include a command decoder (CMD DEC) 401, an address decoder (ADD DEC) 403, a data I/O circuit 405, a data line 407, a MAC operator 409, an AF control circuit 411, a data storage circuit 413, and an output distribution signal generation circuit 415.

The command decoder 401 may decode an external command ECMD to generate an arithmetic control signal M_EN, an activation control signal A_EN, and an activation reset signal A_RST.

The address decoder 403 may receive an external address EADD from an external device that is coupled to the arithmetic device 400. The external device that is coupled to the arithmetic device 400 may be a host, a controller, or a test apparatus. The address decoder 403 may apply a row address RADD to the data storage circuit 413. The address decoder 403 may decode the external address EADD to generate the row address RADD.

The data I/O circuit 405 may receive external data DA from the external device that is coupled to the arithmetic device 400 and may transmit the external data DA to at least one of the MAC operator 409 and the data storage circuit 413 through the data line 407. The data I/O circuit 405 may output data that is output from at least one of the MAC operator 409, the data storage circuit 413, and the output distribution signal generation circuit 415 through the data line 207 as the external data DA.

The MAC operator 409 may receive the arithmetic control signal M_EN from the command decoder 401. The MAC operator 409 may perform a MAC arithmetic operation for vector data VD and weight data WD based on the arithmetic control signal M_EN to generate an arithmetic result signal MOUT.

The AF circuit 411 may receive the activation control signal A_EN from the command decoder 401. The AF circuit 411 may receive the arithmetic result signal MOUT from the MAC operator 409. The AF circuit 411 may generate a column address CADD, a data selection signal DSEL, and an internal control signal ICNT based on the activation control signal A_EN and the arithmetic result signal MOUT.

The data storage circuit 413 may receive the row address RADD from the address decoder 403. The data storage circuit 413 may receive the column address CADD from the AF control circuit 411. The data storage circuit 413 may include multiple memory cell arrays. Various activation functions may be stored in the multiple memory cell arrays that are included in the data storage circuit 413. One of the multiple memory cell arrays that is included in the data storage circuit 413 may be selected by the row address RADD and the column address CADD. The data storage circuit 413 may output an activation function that is stored in one memory cell array, which is selected by the row address RADD and the column address CADD, as activation data AFD.

The output distribution signal generation circuit 415 may receive the activation data AFD from the data storage circuit 413. The output distribution signal generation circuit 415 may receive the data selection signal DSEL and the internal control signal ICNT from the AF circuit 411. The output distribution signal generation circuit 415 may receive the activation reset signal A_RST from the command decoder 401. The output distribution signal generation circuit 415 may generate an output distribution signal ODST based on the activation data AFD, the data selection signal DSEL, the internal control signal ICNT, and the activation reset signal A_RST.

As described above, the arithmetic device 400, according to an embodiment, may output the activation data AFD from the data storage circuit 413 based on the arithmetic result signal MOUT that is generated by the MAC arithmetic operation and may extract the output distribution signal ODST from the activation data AFD to more readily perform an operation that applies an activation function to the arithmetic result signal MOUT.

Figure 27:
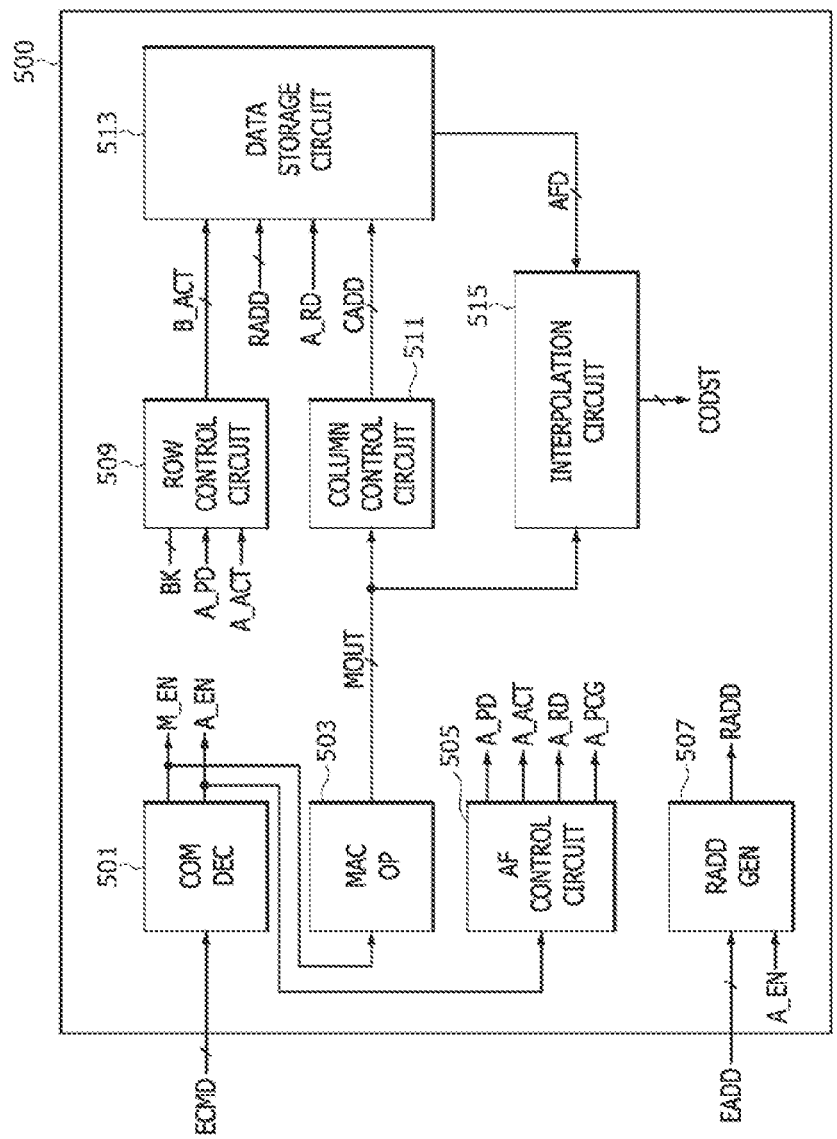
FIG. 27 is a block diagram illustrating a configuration of an arithmetic device according to further another embodiment of the present disclosure.

As illustrated in FIG. 27, an arithmetic device 500, according to further another embodiment, may include a command decoder (COM DEC) 501, a MAC operator 503, an AF control circuit 505, a row address generation circuit (RADD GEN) 507, a row control circuit 509, a column control circuit 511, a data storage circuit 513, and an interpolation circuit 515.

The command decoder 501 may receive an external command ECMD from an external device that is coupled to the arithmetic device 500. The external device may be a host, a controller, or a test apparatus. The command decoder 501 may decode the external command ECMD to generate an arithmetic control signal M_EN and an activation control signal A_EN. The arithmetic control signal M_EN may be activated to perform a MAC arithmetic operation for vector data VD and weight data WD. The activation control signal A_EN may be activated to control an activation operation. The activation operation may include an activation active operation, an activation read operation, and an activation pre-charge operation.

The MAC operator 503 may receive the arithmetic control signal M_EN from the command decoder 501. The MAC operator 503 may perform the MAC arithmetic operation for the vector data VD and the weight data WD based on the arithmetic control signal M_EN to generate an arithmetic result signal MOUT. The MAC operator 503 may apply the arithmetic result signal MOUT to the column control circuit 511 and the interpolation circuit 515. Bits applied to the column control circuit 511 among bits that are included in the arithmetic result signal MOUT may be set to be different from bits applied to the interpolation circuit 515 among bits that are included in the arithmetic result signal MOUT.

The AF control circuit 505 may receive the activation control signal A_EN from the command decoder 501. The AF control circuit 505 may generate an activation period signal A_PD, an activation active signal A_ACT, an activation read signal A_RD, and an activation pre-charge signal A_PCG when the activation control signal A_EN is activated. The activation period signal A_PD may be activated during the activation operation. The activation active signal A_ACT may be activated for the activation active operation. The activation read signal A_RD may be activated for the activation read operation. The activation pre-charge signal A_PCG may be activated for the activation pre-charge operation. The AF control circuit 505 may sequentially generate the activation period signal A_PD, the activation active signal A_ACT, the activation read signal A_RD, and the activation pre-charge signal A_PCG. The AF control circuit 505 may generate the activation period signal A_PD that is activated when the activation control signal A_EN is activated. The AF control circuit 505 may generate the activation active signal A_ACT, which is activated when a first delay period elapses after the activation period signal A_PD is activated. The AF control circuit 505 may generate the activation read signal A_RD, which is activated when a second delay period elapses after the activation active signal A_ACT is activated. The AF control circuit 505 may generate the activation pre-charge signal A_PCG, which is activated when a third delay period elapses after the activation read signal A_RD is activated. The AF control circuit 505 may generate the activation period signal A_PD that is deactivated when the activation pre-charge signal A_PCG is activated.

The row address generation circuit 507 may receive an external address EADD from the external device that is coupled to the arithmetic device 500. The row address generation circuit 507 may receive the activation control signal A_EN from the command decoder 501. The row address generation circuit 507 may generate a row address RADD based on the external address EADD and the activation control signal A_EN. The row address generation circuit 507 may include a mode register (516 of FIG. 29) that stores memory addresses (MADD1 and MADD2 of FIG. 29). The row address generation circuit 507 may output the memory addresses stored in the mode register (516 of FIG. 29) as the row address RADD when the activation control signal A_EN is activated.

The row control circuit 509 may receive the activation period signal A_PD and the activation active signal A_ACT from the AF control circuit 505. The row control circuit 509 may generate a bank active signal B_ACT that is activated to activate all of memory banks (not shown) included in the data storage circuit 513 when the activation active operation is performed during the activation operation based on a bank selection signal BK, the activation period signal A_PD, and the activation active signal A_ACT. The bank selection signal BK may be generated by decoding the external address EADD.

The column control circuit 511 may receive the arithmetic result signal MOUT from the MAC operator 503. The column control circuit 511 may generate a column address CADD based on the arithmetic result signal MOUT. The column control circuit 511 may generate the column address CADD whose logic level combination is set according to a logic level combination of some bits among bits that are included in the arithmetic result signal MOUT.

The data storage circuit 513 may generate activation data AFD based on the bank active signal B_ACT, the activation read signal A_RD, the row address RADD, and the column address CADD. The data storage circuit 513 may include multiple memory banks (not shown). Although the present embodiment is described in conjunction with a case that the data storage circuit 513 includes multiple memory banks, the memory banks may be merely an example of a memory storage region. Accordingly, in some other embodiments, the data storage circuit 513 may include a memory storage region other than the memory banks. The data storage circuit 513 may perform the activation active operation for all of the memory banks based on the bank active signal B_ACT when the activation operation is performed. Each of the memory banks that are included in the data storage circuit 513 may include multiple memory cell arrays, and each of the multiple memory cell arrays may include multiple memory cells that are located at cross points of multiple word lines and multiple bit lines. The data storage circuit 513 may output data stored in at least one memory cell, which is coupled to one word line selected by the row address RADD and at least one bit line selected by the column address CADD, as the activation data AFD when the activation read operation is performed by the activation read signal that is activated.

The interpolation circuit 515 may receive the arithmetic result signal MOUT from the MAC operator 503. The interpolation circuit 515 may receive the activation data AFD from the data storage circuit 513. The interpolation circuit 515 may generate a calibrated output distribution signal CODST based on the arithmetic result signal MOUT and the activation data AFD.

Figure 28:
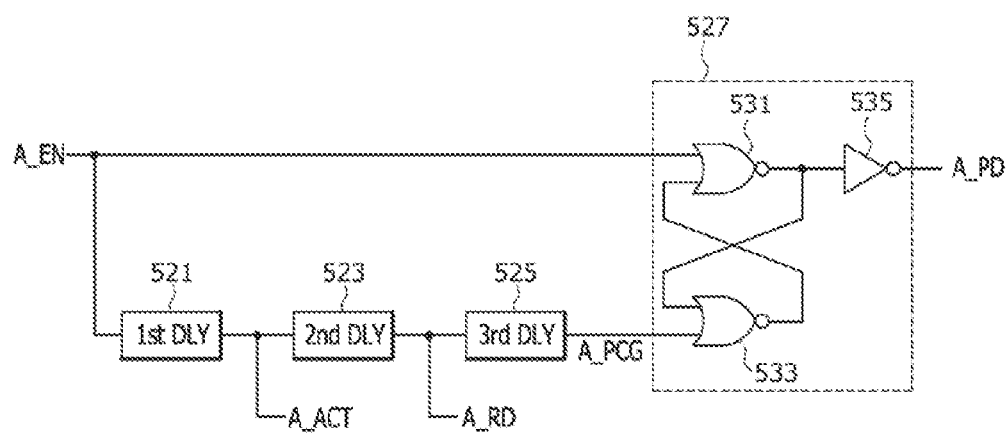
FIG. 28 illustrates a configuration of an AF control circuit included in the arithmetic device illustrated in FIG. 27.

As illustrated in FIG. 28, the AF control circuit 505 may include a first delay circuit 521, a second delay circuit 523, a third delay circuit 525, and a period signal latch circuit 527.

The first delay circuit 521 may generate the activation active signal A_ACT based on the activation control signal A_EN. The first delay circuit 521 may delay the activation control signal A_EN by a first delay period to generate the activation active signal A_ACT. The first delay circuit 521 may generate the activation active signal A_ACT, which is activated when the first delay period elapses after the activation control signal A_EN is activated.

The second delay circuit 523 may generate the activation read signal A_RD based on the activation active signal A_ACT. The second delay circuit 523 may delay the activation active signal A_ACT by a second delay period to generate the activation read signal A_RD. The second delay circuit 523 may generate the activation read signal A_RD, which is activated when the second delay period elapses after the activation active signal A_ACT is activated.

The third delay circuit 525 may generate the activation pre-charge signal A_PCG based on the activation read signal A_RD. The third delay circuit 525 may delay the activation read signal A_RD by a third delay period to generate the activation pre-charge signal A_PCG. The third delay circuit 525 may generate the activation pre-charge signal A_PCG, which is activated when the third delay period elapses after the activation read signal A_RD is activated.

The period signal latch circuit 527 may include NOR gates 531 and 533 and an inverter 535. The NOR gate 531 may receive the activation control signal A_EN and an output signal of the NOR gate 533 to perform a logical NOR operation for the activation control signal A_EN and the output signal of the NOR gate 533. The NOR gate 533 may receive the activation pre-charge signal A_PCG and an output signal of the NOR gate 531 to perform a logical NOR operation for the activation pre-charge signal A_PCG and the output signal of the NOR gate 531. The inverter 535 may inversely buffer the output signal of the NOR gate 531 to generate the activation period signal A_PD. The period signal latch circuit 527 may activate the activation period signal A_PD to a logic "high" level when the activation control signal A_EN is activated to have a logic "high" level. The period signal latch circuit 527 may deactivate the activation period signal A_PD to a logic "low" level when the activation pre-charge signal A_PCG is activated to have a logic "high" level.

The AF control circuit 505 may generate the activation period signal A_PD that is activated to have a logic "high" level when the activation control signal A_EN is activated to have a logic "high" level. The AF control circuit 505 may generate the activation active signal A_ACT, which is activated to have a logic "high" level when the first delay period elapses after the activation control signal A_EN is activated to have a logic "high" level. The AF control circuit 505 may generate the activation read signal A_RD, which is activated to have a logic "high" level when the second delay period elapses after the activation active signal A_ACT is activated to have a logic "high" level. The AF control circuit 505 may generate the activation pre-charge signal A_PCG, which is activated to have a logic "high" level when the third delay period elapses after the activation read signal A_RD is activated to have a logic "high" level. The AF control circuit 505 may generate the activation period signal A_PD that is deactivated to have a logic "low" level when the activation pre-charge signal A_PCG is activated to have a logic "high" level.

Figure 29:
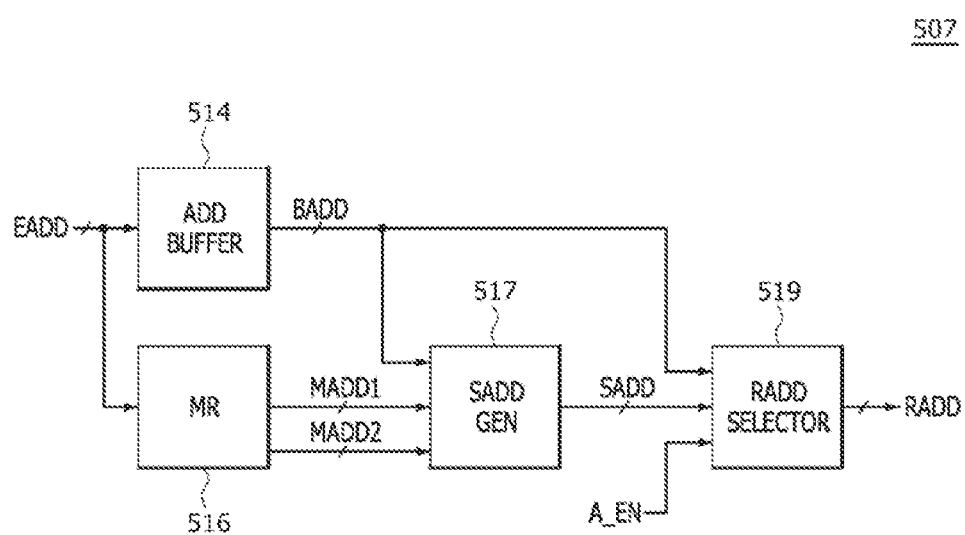
FIG. 29 is a block diagram illustrating a configuration of a row address generation circuit included in the arithmetic device illustrated in FIG. 27.

As illustrated in FIG. 29, the row address generation circuit 507 may include an address buffer (ADD BUFFER) 514, the mode register (MR) 516, a selection address generator (SADD GEN) 517, and a row address selector (RADD SELECTOR) 519.

The address buffer 514 may generate a buffered address BADD based on the external address EADD. The address buffer 514 may buffer the external address EADD to generate the buffered address BADD.

The mode register 516 may extract a first memory address MADD1 and a second memory address MADD2 from the external address EADD to store the first memory address MADD1 and the second memory address MADD2 therein when the mode register set operation is performed. The mode register 516 may apply the first memory address MADD1 and the second memory address MADD2 to the selection address generator 517.

The selection address generator 517 may receive the buffered address BADD from the address buffer 514. The selection address generator 517 may receive the first memory address MADD1 and the second memory address MADD2 from the mode register 516. The selection address generator 517 may generate a selection address SADD from the first memory address MADD1 and the second memory address MADD2 based on the buffered address BADD. The selection address generator 517 may output the first memory address MADD1 as the selection address SADD when the buffered address BADD has a first logic level and may output the second memory address MADD2 as the selection address SADD when the buffered address BADD has a second logic level. At least one of bits that are included in the buffered address BADD may be input to the selection address generator 517. The number of bits that are input to the selection address generator 517 among the bits that are included in the buffered address BADD may be set to be different according to the embodiments. In the present embodiment, the first logic level may be set as a logic "low" level and the second logic level may be set as a logic "high" level. However, the present disclosure is not limited to the present embodiment in which the first logic level is set as a logic "low" level and the second logic level is set as a logic "high" level. That is, in some other embodiments, the first logic level may be set as a logic "high" level and the second logic level may be set as a logic "low" level.

The row address selector 519 may receive the buffered address BADD from the address buffer 514. The row address selector 519 may receive the selection address SADD from the selection address generator 517. The row address selector 519 may generate the row address RADD from the buffered address BADD and the selection address SADD based on the activation control signal A_EN. The row address selector 519 may select and output the selection address SADD as the row address RADD when the activation control signal A_EN is activated. The row address selector 519 may select and output the buffered address BADD as the row address RADD when the activation control signal A_EN is deactivated. The number of bits that are included in each of the buffered address BADD, the selection address SADD, and the row address RADD may be set to be different according to the embodiments.

Figure 30:
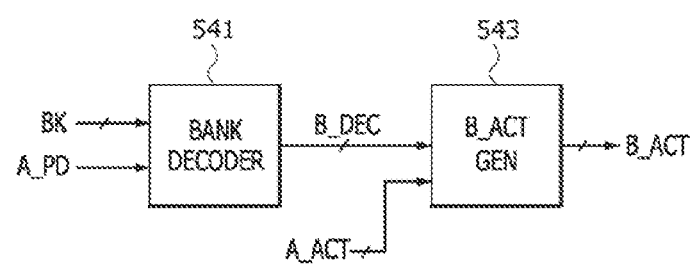
FIG. 30 is a block diagram illustrating a configuration of a row control circuit included in the arithmetic device illustrated in FIG. 27.

As illustrated in FIG. 30, the row control circuit 509 may include a bank decoder 541 and a bank active signal generation circuit (B_ACT GEN) 543.

The bank decoder 541 may generate a bank decoded signal B_DEC based on the bank selection signal BK and the activation period signal A_PD. The bank decoder 541 may decode the bank selection signal BK to generate the bank decoded signal B_DEC when the activation period signal A_PD that is input to the bank decoder 541 is deactivated by non-execution of the activation operation. The bank decoder 541 may generate the bank decoded signal B_DEC with multiple bits that are all activated regardless of the bank selection signal BK when the activation period signal A_PD that is input to the bank decoder 541 is activated by execution of the activation operation. The number of bits that are included in each of the bank selection signal BK and the bank decoded signal B_DEC may be set to be different according to the embodiments.

The bank active signal generation circuit 543 may receive the bank decoded signal B_DEC from the bank decoder 541. The bank active signal generation circuit 543 may generate the bank active signal B_ACT from the bank decoded signal B_DEC based on the activation active signal A_ACT. The bank active signal generation circuit 543 may generate the bank active signal B_ACT from the bank decoded signal B_DEC when the activation active signal A_ACT is activated by execution of the activation active operation. The bank active signal generation circuit 543 may buffer the bank decoded signal B_DEC to generate the bank active signal B_ACT. The bank active signal generation circuit 543 may generate the bank active signal B_ACT with multiple bits that are all activated when the bank decoded signal B_DEC with multiple bits that are all activated is input to the bank active signal generation circuit 543 and the activation active operation is performed.

Figure 31:
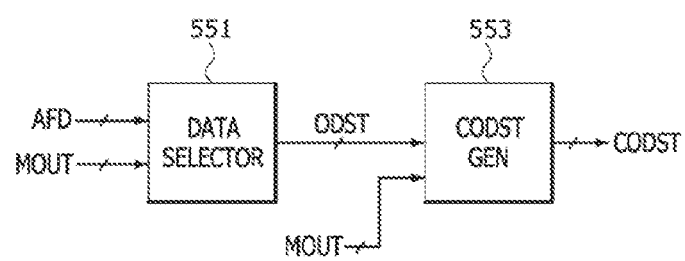
FIG. 31 is a block diagram illustrating a configuration of an interpolation circuit included in the arithmetic device illustrated in FIG. 27.

As illustrated in FIG. 31, the interpolation circuit 515 may include a data selector 551 and a calibrated output distribution signal generator (CODST GEN) 553.

The data selector 551 may generate an output distribution signal ODST from the activation data AFD based on the arithmetic result signal MOUT. The output distribution signal ODST may include bits for representing an activation function result value, which is deduced when an activation function is applied to a MAC arithmetic result, in a floating-point number form and bits for representing information regarding the activation function applied to the MAC arithmetic result.

The calibrated output distribution signal generator 553 may receive the output distribution signal ODST from the data selector 551. The calibrated output distribution signal generator 553 may calibrate the output distribution signal ODST based on the arithmetic result signal MOUT to generate the calibrated output distribution signal CODST.

Figure 32:
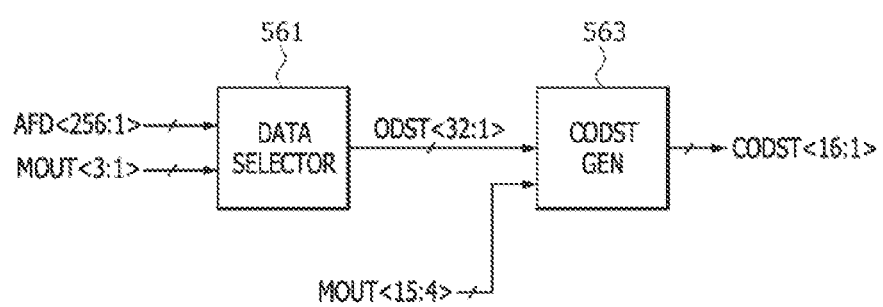
FIG. 32 is a block diagram illustrating a configuration of another example of the interpolation circuit illustrated in FIG. 31.

Referring to FIG. 32, an interpolation circuit 515A that corresponds to another example of the interpolation circuit 515 illustrated in FIG. 31 is illustrated. As illustrated in FIG. 32, the interpolation circuit 515A may include a data selector 561 and a calibrated output distribution signal generator (CODST GEN) 563.

The data selector 561 may extract first to $32^{nd}$ bits ODST<32:1> of the output distribution signal ODST from first to $256^{th}$ bits AFD<256:1> of the activation data AFD based on first to third bits MOUT<3:1> (hereinafter, referred to as a first bit set) of the arithmetic result signal MOUT. The data selector 561 may select 32 bits from the first to $256^{th}$ bits AFD<256:1> of the activation data AFD based on a logic level combination of the first bit set MOUT<3:1> of the arithmetic result signal MOUT to output the selected 32 bits among the first to 256$^{th}$ bits AFD<256:1> of the activation data AFD as the first to 32$^{nd}$ bits ODST<32:1> of the output distribution signal ODST. The data selector 561 may output the first to 32$^{nd}$ bits AFD<32:1> of the activation data AFD as the first to 32$^{nd}$ bits ODST<32:1> of the output distribution signal ODST when the first bit set MOUT<3:1> of the arithmetic result signal MOUT has a first logic level combination. The first bit set MOUT<3:1> with the first logic level combination in the arithmetic result signal MOUT may correspond to a first arithmetic result value, and the first to 32$^{nd}$ bits AFD<32:1> of the activation data AFD may correspond to a first selected activation result value. The data selector 561 may output the 33$^{rd}$ to 64$^{th}$ bits AFD<64:33> of the activation data AFD as the first to 32$^{nd}$ bits ODST<32:1> of the output distribution signal ODST when the first bit set MOUT<3:1> of the arithmetic result signal MOUT has a second logic level combination. The first bit set MOUT<3:1> with the second logic level combination in the arithmetic result signal MOUT may correspond to a second arithmetic result value, and the 33$^{rd}$ to 64$^{th}$ bits AFD<64:33> of the activation data AFD may correspond to a second selected activation result value. The data selector 561 may output the 65$^{th}$ to 96$^{th}$ bits AFD<96:65> of the activation data AFD as the first to 32$^{nd}$ bits ODST<32:1> of the output distribution signal ODST when the first bit set MOUT<3:1> of the arithmetic result signal MOUT has a third logic level combination. The first bit set MOUT<3:1> with the third logic level combination in the arithmetic result signal MOUT may correspond to a third arithmetic result value, and the 65$^{th}$ to 96$^{th}$ bits AFD<96:65> of the activation data AFD may correspond to a third selected activation result value. The data selector 561 may output the 97$^{th}$ to 128$^{th}$ bits AFD<128:97> of the activation data AFD as the first to 32$^{nd}$ bits ODST<32:1> of the output distribution signal ODST when the first bit set MOUT<3:1> of the arithmetic result signal MOUT has a fourth logic level combination. The first bit set MOUT<3:1> with the fourth logic level combination in the arithmetic result signal MOUT may correspond to a fourth arithmetic result value, and the 97$^{th}$ to 128$^{th}$ bits AFD<128:97> of the activation data AFD may correspond to a fourth selected activation result value. The data selector 561 may output the 129$^{th}$ to 160$^{th}$ bits AFD<160:129> of the activation data AFD as the first to 32$^{nd}$ bits ODST<32:1> of the output distribution signal ODST when the first bit set MOUT<3:1> of the arithmetic result signal MOUT has a fifth logic level combination. The first bit set MOUT<3:1> with the fifth logic level combination in the arithmetic result signal MOUT may correspond to a fifth arithmetic result value, and the 129$^{th}$ to 160$^{th}$ bits AFD<160:129> of the activation data AFD may correspond to a fifth selected activation result value. The data selector 561 may output the 161$^{st}$ to 192$^{nd}$ bits AFD<192:161> of the activation data AFD as the first to 32$^{nd}$ bits ODST<32:1> of the output distribution signal ODST when the first bit set MOUT<3:1> of the arithmetic result signal MOUT has a sixth logic level combination. The first bit set MOUT<3:1> with the sixth logic level combination in the arithmetic result signal MOUT may correspond to a sixth arithmetic result value, and the 161$^{st}$ to 192$^{nd}$ bits AFD<192:161> of the activation data AFD may correspond to a sixth selected activation result value. The data selector 561 may output the 193$^{rd}$ to 224$^{th}$ bits AFD<224:193> of the activation data AFD as the first to 32$^{nd}$ bits ODST<32:1> of the output distribution signal ODST when the first bit set MOUT<3:1> of the arithmetic result signal MOUT has a seventh logic level combination. The first bit set MOUT<3:1> with the seventh logic level combination in the arithmetic result signal MOUT may correspond to a seventh arithmetic result value, and the 193$^{rd}$ to 224$^{th}$ bits AFD<224:193> of the activation data AFD may correspond to a seventh selected activation result value. The data selector 561 may output the 225$^{th}$ to 256$^{th}$ bits AFD<256:225> of the activation data AFD as the first to 32$^{nd}$ bits ODST<32:1> of the output distribution signal ODST when the first bit set MOUT<3:1> of the arithmetic result signal MOUT has an eighth logic level combination. The first bit set MOUT<3:1> with the eighth logic level combination in the arithmetic result signal MOUT may correspond to an eighth arithmetic result value, and the 225$^{th}$ to 256$^{th}$ bits AFD<256:225> of the activation data AFD may correspond to an eighth selected activation result value.

The calibrated output distribution signal generator 563 may calibrate the first to 32$^{nd}$ bits ODST<32:1> of the output distribution signal ODST to generate first to 16$^{th}$ bits CODST<16:1> of the calibrated output distribution signal CODST based on fourth to 15$^{th}$ bits MOUT<15:4> (hereinafter, referred to as a second bit set) of the arithmetic result signal MOUT. The calibrated output distribution signal generator 563 may perform a multiplying operation for multiplying a value that corresponds to variation of the arithmetic result value by a value that corresponds to variation of the selected activation result value to generate a multiplication result value, may perform an adding operation for adding the multiplication result value to a mantissa of the selected activation result value to generate a calibration signal (CMAN of FIG. 34), and may generate the first to 16$^{th}$ bits CODST<16:1> of the calibrated output distribution signal CODST with a calibrated activation result value based on the calibration signal CMAN. A configuration and an operation of the calibrated output distribution signal generator 563 will be described in more detail with reference to FIGS. 34 to 40 later.

Figure 33:
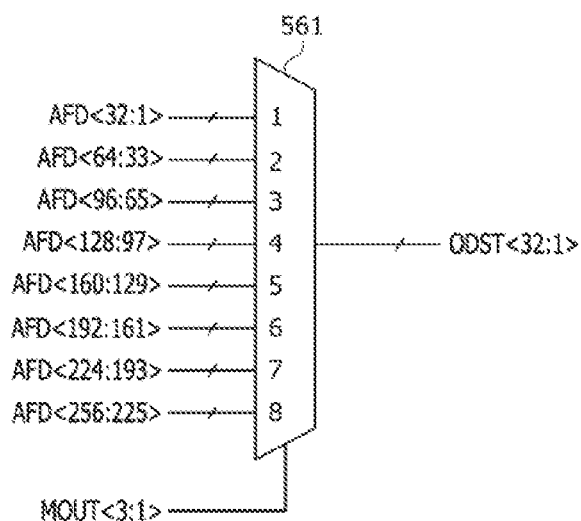
FIG. 33 illustrates a data selector included in the interpolation circuit illustrated in FIG. 32.

As illustrated in FIG. 33, the data selector 561 may output the first to 32$^{nd}$ bits AFD<32:1> (corresponding to the first selected activation result value) of the activation data AFD as the first to 32$^{nd}$ bits ODST<32:1> of the output distribution signal ODST when the first bit set MOUT<3:1> of the arithmetic result signal MOUT has the first arithmetic result value. The data selector 561 may output the 33$^{nd}$ to 64$^{th}$ bits AFD<64:33> (corresponding to the second selected activation result value) of the activation data AFD as the first to 32$^{nd}$ bits ODST<32:1> of the output distribution signal ODST when the first bit set MOUT<3:1> of the arithmetic result signal MOUT has the second arithmetic result value. The data selector 561 may output the 65$^{th}$ to 96$^{th}$ bits AFD<96:65> (corresponding to the third selected activation result value) of the activation data AFD as the first to 32$^{nd}$ bits ODST<32:1> of the output distribution signal ODST when the first bit set MOUT<3:1> of the arithmetic result signal MOUT has the third arithmetic result value. The data selector 561 may output the 97$^{th}$ to 128$^{th}$ bits AFD<128:97> (corresponding to the fourth selected activation result value) of the activation data AFD as the first to 32$^{nd}$ bits ODST<32:1> of the output distribution signal ODST when the first bit set MOUT<3:1> of the arithmetic result signal MOUT has the fourth arithmetic result value. The data selector 561 may output the 129$^{st}$ to 160$^{th}$ bits AFD<160:129> (corresponding to the fifth selected activation result value) of the activation data AFD as the first to 32$^{nd}$ bits ODST<32:1> of the output distribution signal ODST when the first bit set MOUT<3:1> of the arithmetic result signal MOUT has the fifth arithmetic result value. The data selector 561 may output the 161$^{st}$ to 192$^{nd}$ bits AFD<192:161> (corresponding to the sixth selected activation result value) of the activation data AFD as the first to 32$^{nd}$ bits ODST<32:1> of the output distribution signal ODST when the first bit set MOUT<3:1> of the arithmetic result signal MOUT has the sixth arithmetic result value. The data selector 561 may output the 193$^{rd}$ to 224$^{th}$ bits AFD<224:193> (corresponding to the seventh selected activation result value) of the activation data AFD as the first to 32$^{nd}$ bits ODST<32:1> of the output distribution signal ODST when the first bit set MOUT<3:1> of the arithmetic result signal MOUT has the seventh arithmetic result value. The data selector 561 may output the 225$^{st}$ to 256$^{th}$ bits AFD<256:225> (corresponding to the eighth selected activation result value) of the activation data AFD as the first to 32$^{nd}$ bits ODST<32:1> of the output distribution signal ODST when the first bit set MOUT<3:1> of the arithmetic result signal MOUT has the eighth arithmetic result value.

Figure 34:
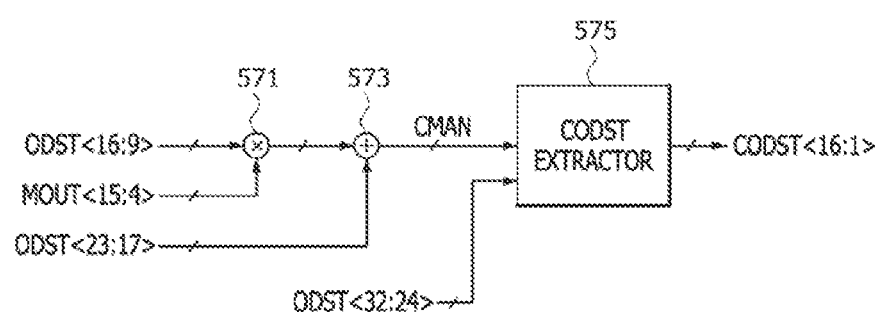
FIG. 34 illustrates a configuration of an example of a calibrated output distribution signal generator included in the interpolation circuit illustrated in FIG. 32.

Referring to FIG. 34, a calibrated output distribution signal generator 563A that corresponds to an example of the calibrated output distribution signal generator 563 is illustrated. As illustrated in FIG. 34, the calibrated output distribution signal generator 563A may include a multiplier 571, an adder 573, and a calibrated output distribution signal extractor (CODST EXTRACTOR) 575.

The multiplier 571 may perform a multiplying operation for multiplying the ninth to sixteenth bits ODST<16:9> of the output distribution signal ODST by the second bit set MOUT<15:4> of the arithmetic result signal MOUT. The ninth to sixteenth bits ODST<16:9> (hereinafter, referred to as a first bit set) of the output distribution signal ODST may correspond to a difference between an activation result value that is selected by the first bit set MOUT<3:1> of the arithmetic result signal and a next activation result value. For example, when the first bit set MOUT<3:1> of the arithmetic result signal MOUT is set to have the third logic level combination so that the first to 32$^{nd}$ bits ODST<32:1> of the output distribution signal ODST are set to have the third selected activation result value, the first bit set ODST<16:9> of the output distribution signal ODST may correspond to a difference between the fourth selected activation result value and the third selected activation result value. The second bit set MOUT<15:4> of the arithmetic result signal MOUT may correspond to variation of an arithmetic result value. For example, when the first bit set MOUT<3:1> of the arithmetic result signal MOUT is set as the third logic level combination to have the third arithmetic result value, the second bit set MOUT<15:4> of the arithmetic result signal MOUT may correspond to variation of the third arithmetic result value.

The adder 573 may add the 17$^{th}$ to 23$^{rd}$ bits ODST<23:17> (hereafter, referred to as a second bit set) of the output distribution signal ODST to an output signal of the multiplier 571 to generate the calibration signal CMAN. The second bit set ODST<23:17> of the output distribution signal ODST may correspond to a mantissa of a floating-point number when the selected activation result value is represented in a floating-point number form. The calibration signal CMAN may correspond to a mantissa of a floating-point number when the calibrated activation result value is represented in a floating-point number form. The calibrated activation result value may be set as value that is deduced when an activation function is applied to an arithmetic result value in which variation of an arithmetic result value set by the second bit set MOUT<15:4> of the arithmetic result signal MOUT is reflected.

The calibrated output distribution signal extractor 575 may receive the calibration signal CMAN from the adder 573. The calibrated output distribution signal extractor 575 may generate the first to 16$^{th}$ bits CODST<16:1> of the calibrated output distribution signal CODST from the 24$^{st}$ to 32$^{nd}$ bits ODST<32:24> (hereinafter, referred to as a third bit set) of the output distribution signal ODST based on the calibration signal CMAN. The third bit set ODST<32:24> of the output distribution signal ODST may correspond to a sign and an exponent of a floating-point number when the selected activation result value is represented in a floating-point number form. The calibrated output distribution signal extractor 575 may select the selected activation result value that is adjacent to the activation result value that is calibrated by the calibration signal CMAN as the calibrated activation result value and may generate the first to 16$^{th}$ bits CODST<16:1> of the calibrated output distribution signal CODST with the calibrated activation result value. For example, while the third selected activation result value is selected by the first bit set MOUT<3:1> of the arithmetic result signal MOUT, the calibrated output distribution signal extractor 575 may set the third selected activation result value as the calibrated activation result value when the calibrated activation result value is adjacent to the third selected activation result value and may set the fourth selected activation result value as the calibrated activation result value when the calibrated activation result value is adjacent to the fourth selected activation result value.

Figure 35:
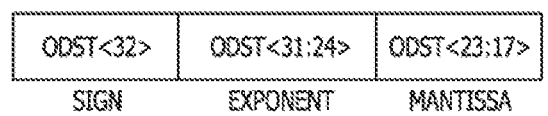
FIG. 35 is a schematic diagram illustrating a configuration of an output distribution signal that is input to the calibrated output distribution signal generator illustrated in FIG. 34.

Referring to FIG. 35, when the selected activation result value that is selected by the first bit set MOUT<3:1> of the arithmetic result signal MOUT among bits that are included in the second bit set ODST<23:17> and the third bit set ODST<32:24> of the output distribution signal ODST is represented in a floating-point number form, a sign, an exponent, and a mantissa of the floating-point number are illustrated. The 32$^{nd}$ bit ODST<32> in the third bit set ODST<32:24> of the output distribution signal ODST may correspond to a sign of a floating-point number when the selected activation result value is represented in a floating-point number form. The 24$^{th}$ to 31$^{st}$ bits ODST<31:24> in the third bit set ODST<32:24> of the output distribution signal ODST may correspond to an exponent of a floating-point number when the selected activation result value is represented in a floating-point number form. The second bit set ODST<23:17> of the output distribution signal ODST may correspond to a mantissa of a floating-point number when the selected activation result value is represented in a floating-point number form.

Figure 36:
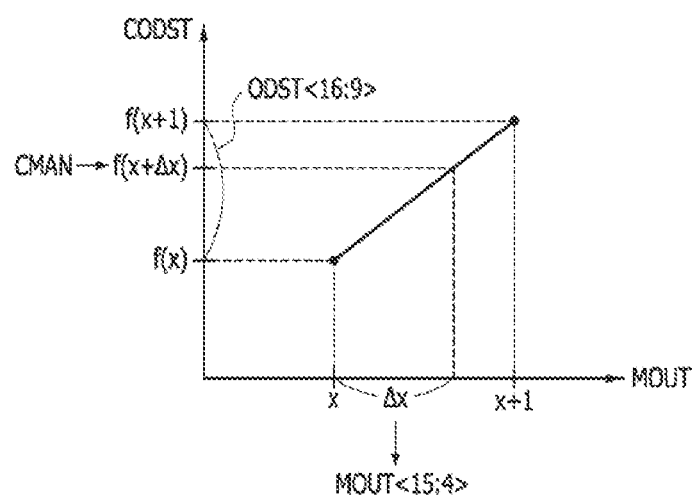
FIG. 36 is a graph illustrating an operation of the calibrated output distribution signal generator illustrated in FIG. 34.

An operation of the calibrated output distribution signal generator 563A to which an activation function that selects a first selected activation result value "f(x)" relative to a first arithmetic result value "x" and selects a second selected activation result value "f(x+1)" relative to a second arithmetic result value "x+1" is applied will be described hereinafter with reference to FIG. 36. As illustrated in FIG. 36, the calibration signal CMAN may be generated by multiplying variation "Δx" of the arithmetic result value set by the second bit set MOUT<15:4> of the arithmetic result signal MOUT by a difference "f(x+1)−f(x)" between the selected activation result value that is selected by the first bit set ODST<16:9> of the output distribution signal ODST and a next selected activation result value to generate a multiplication result value and by adding the multiplication result value to the mantissa of the selected activation result value. Because the calibration signal CMAN includes information regarding the calibrated activation result value "f(x+Δx)", the calibrated output distribution signal CODST with the calibrated activation result value may be generated based on the calibration signal CMAN. Because the calibrated activation result value "f(x+Δx)" is adjacent to a next selected activation result value "f(x+1)", the next selected activation result value "f(x+1)" may be selected and outputted as the calibrated activation result value of the calibrated output distribution signal CODST.

Figure 37:
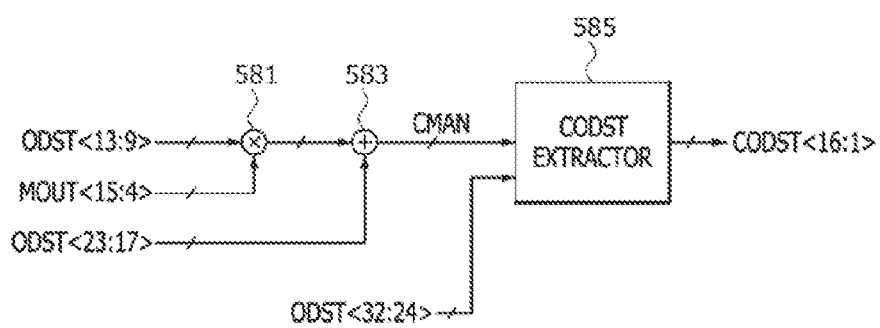
FIG. 37 illustrates a configuration of yet another example of a calibrated output distribution signal generator included in the interpolation circuit illustrated in FIG. 32.

FIG. 37 illustrates a calibrated output distribution signal generator 563B that corresponds to another example of the calibrated output distribution signal generator 563. As illustrated in FIG. 37, the calibrated output distribution signal generator 563B may include a multiplier 581, an adder 583, and a calibrated output distribution signal extractor (CODST EXTRACTOR) 585. The calibrated output distribution signal generator 563B may have substantially the same configuration as the calibrated output distribution signal generator 563A except that the ninth to $13^{th}$ bits ODST<13:9> of the output distribution signal ODST instead of the ninth to $16^{th}$ bits ODST<16:9> of the output distribution signal ODST are input to the calibrated output distribution signal generator 563B. Thus, detailed descriptions of the multiplier 581, the adder 583, and the calibrated output distribution signal extractor 585 will be omitted hereinafter. While the calibrated output distribution signal generator 563A sets a difference between the selected activation result value and a next selected activation result value based on the ninth to 16th bits ODST<16:9> of the output distribution signal ODST, the calibrated output distribution signal generator 563B may set the difference between the selected activation result value and the next selected activation result value based on the ninth to $13^{th}$ bits ODST<13:9> of the output distribution signal ODST.

Figure 38:
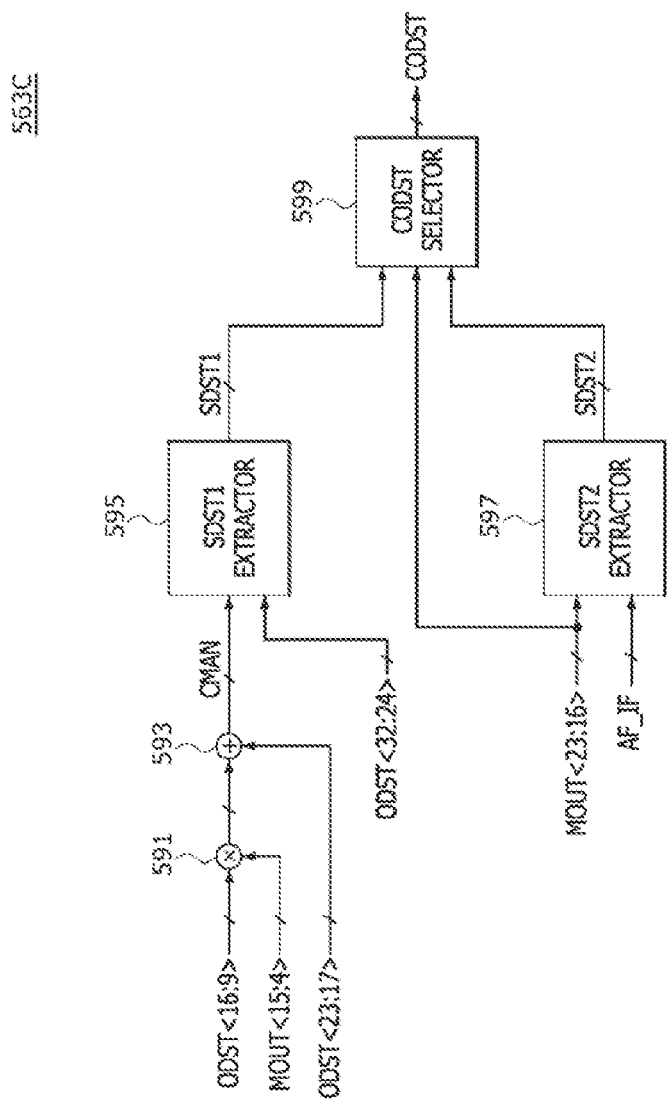
FIG. 38 illustrates a configuration of still another example of a calibrated output distribution signal generator included in the interpolation circuit illustrated in FIG. 32.

Referring to FIG. 38, a calibrated output distribution signal generator 563C that corresponds to yet another example of the calibrated output distribution signal generator 563 is illustrated. As illustrated in FIG. 38, the calibrated output distribution signal generator 563C may include a multiplier 591, an adder 593, a first selected output distribution signal extractor (SDST1 EXTRACTOR) 595, a second selected output distribution signal extractor (SDST2 EXTRACTOR) 597, and a calibrated output distribution signal selector 599. The multiplier 591 and the adder 593 may have the same configurations as the multiplier 571 and the adder 573 included in the calibrated output distribution signal generator 563A illustrated in FIG. 34, respectively. Thus, detailed descriptions of the multiplier 591 and the adder 593 will be omitted hereinafter.

The first selected output distribution signal extractor 595 may receive a calibration signal CMAN from the adder 593. The first selected output distribution signal extractor 595 may generate a first selected output distribution signal SDST1 from the third bit set ODST<32:24> of the output distribution signal ODST based on the calibration signal CMAN. The third bit set ODST<32:24> of the output distribution signal ODST may correspond to a sign and an exponent of a floating-point number when the selected activation result value is represented in a floating-point number form. The first selected output distribution signal extractor 595 may select the selected activation result value that is adjacent to the activation result value that is calibrated by the calibration signal CMAN as the calibrated activation result value and may generate the first selected output distribution signal SDST1 with the calibrated activation result value that is selected.

The second selected output distribution signal extractor 597 may generate a second selected output distribution signal SDST2 based on an activation function information signal AF_IF and the $16^{th}$ to $23^{rd}$ bits MOUT<23:16> (hereinafter, referred to as a third bit set) of the arithmetic result signal MOUT. The third bit set MOUT<23:16> of the arithmetic result signal MOUT may include information regarding whether the arithmetic result value is equal to or less than an arithmetic lower limit value or is equal to or greater than an arithmetic upper limit value. The activation function information signal AF_IF may include information regarding the activation function. For example, the activation function applied to the arithmetic device 500 may be set as a SIGMOID function when the activation function information signal AF_IF has a first logic level and may be set as a hyperbolic tangent function when the activation function information signal AF_IF has a second logic level. The second selected output distribution signal extractor 597 may generate the second selected output distribution signal SDST2 that corresponds to zero when the arithmetic result value is equal to or less than the arithmetic lower limit value by the third bit set MOUT<23:16> of the arithmetic result signal MOUT while the activation function is set as the SIGMOID function by the activation function information signal AF_IF with the first logic level. The second selected output distribution signal extractor 597 may generate the second selected output distribution signal SDST2 that corresponds to one when the arithmetic result value is equal to or greater than the arithmetic upper limit value by the third bit set MOUT<23:16> of the arithmetic result signal MOUT while the activation function is set as the SIGMOID function by the activation function information signal AF_IF with the first logic level. The second selected output distribution signal extractor 597 may generate the second selected output distribution signal SDST2 that corresponds to minus one (−1) when the arithmetic result value is equal to or less than the arithmetic lower limit value by the third bit set MOUT<23:16> of the arithmetic result signal MOUT while the activation function is set as the hyperbolic tangent function by the activation function information signal AF_IF with the second logic level. The second selected output distribution signal extractor 597 may generate the second selected output distribution signal SDST2 that corresponds to one when the arithmetic result value is equal to or greater than the arithmetic upper limit value by the third bit set MOUT<23:16> of the arithmetic result signal MOUT while the activation function is set as the hyperbolic tangent function by the activation function information signal AF_IF with the second logic level.

The calibrated output distribution signal selector 599 may output one of the first selected output distribution signal SDST1 and the second selected output distribution signal SDST2 as the calibrated output distribution signal CODST based on the third bit set MOUT<23:16> of the arithmetic result signal MOUT. The calibrated output distribution signal selector 599 may output the first selected output distribution signal SDST1 as the calibrated output distribution signal CODST when the arithmetic result value is between the arithmetic upper limit value and the arithmetic lower limit value by the third bit set MOUT<23:16> of the arithmetic result signal MOUT. The calibrated output distribution signal selector 599 may output the second selected output distribution signal SDST2 as the calibrated output distribution signal CODST when the arithmetic result value is equal to or less than the arithmetic lower limit value or is equal to or greater than the arithmetic upper limit value by the third bit set MOUT<23:16> of the arithmetic result signal MOUT.

Figure 39:
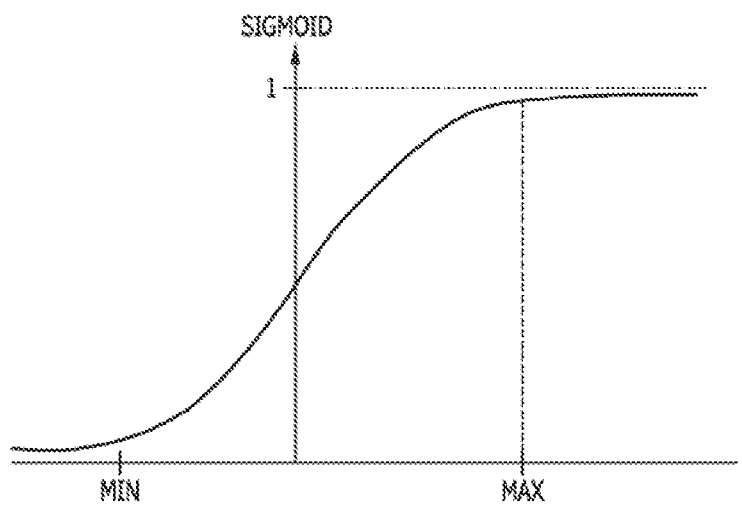
FIGS. 39 and 40 are graphs illustrating activation functions.

Referring to FIG. 39, a graph of the SIGMOID function is illustrated. The activation result value of the SIGMOID function may converge on zero when the arithmetic result value of the SIGMOID function is equal to or less than the arithmetic lower limit value MIN and may converge on one when the arithmetic result value of the SIGMOID function is equal to or greater than the arithmetic upper limit value MAX.

Figure 40:
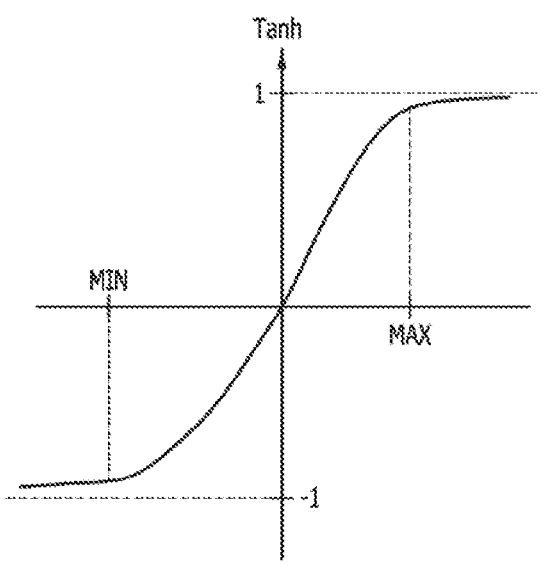

Referring to FIG. 40, a graph of the hyperbolic tangent function is illustrated. The activation result value of the hyperbolic tangent function may converge on minus one (−1) when the arithmetic result value of the hyperbolic tangent function is equal to or less than the arithmetic lower limit value MIN and may converge on one when the arithmetic result value of the hyperbolic tangent function is equal to or greater than the arithmetic upper limit value MAX.

An operation of the arithmetic device 500 will be described hereinafter with reference to FIGS. 41 to 45.

Figure 41:
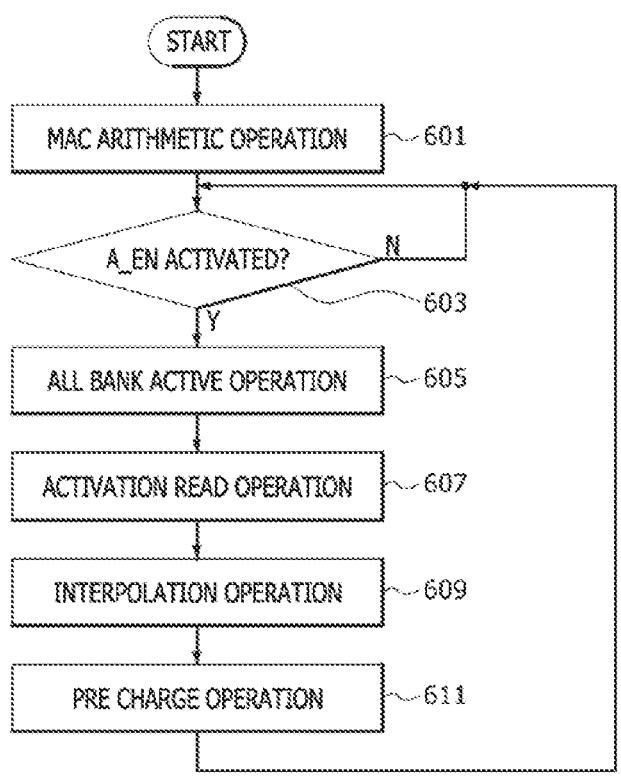
FIGS. 41 to 45 illustrate an operation of the arithmetic device illustrated in FIG. 27.
Figure 42:
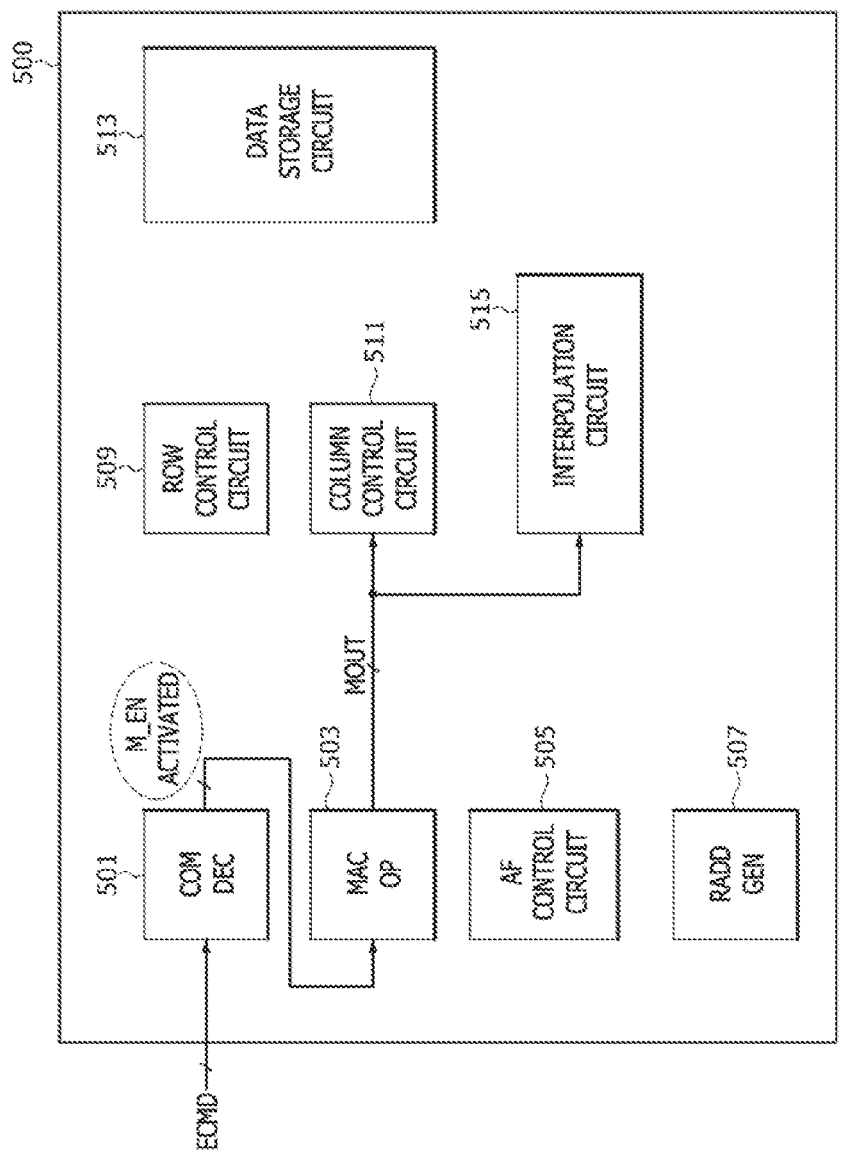

First, as illustrated in FIGS. 41 and 42, the MAC arithmetic operation may be performed when the command decoder 501 decodes the external command ECMD to generate the arithmetic control signal M_EN that is activated (see a step 601). The MAC operator 503 may apply the arithmetic result signal MOUT that is generated by the MAC arithmetic operation to the column control circuit 511 and the interpolation circuit 515.

Figure 43:
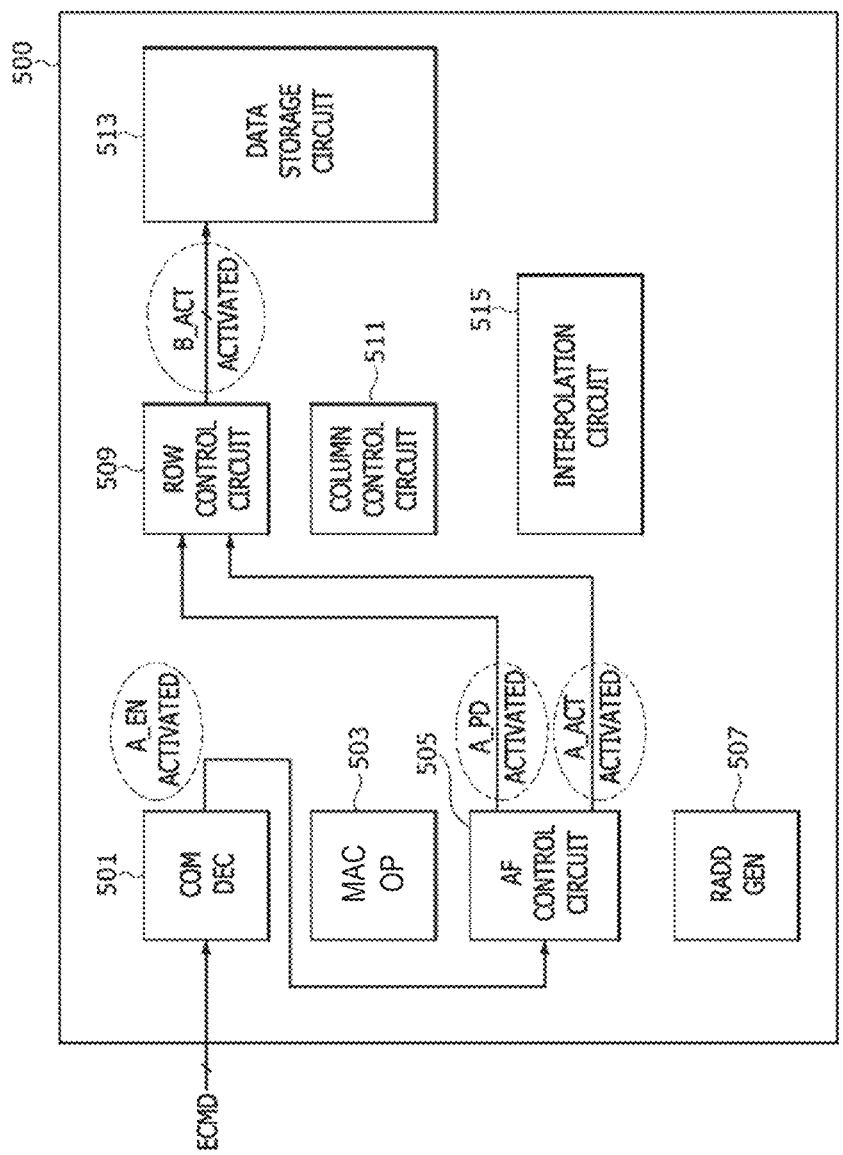

Next, as illustrated in FIGS. 41 and 43, the AF control circuit 505 may determine whether the activation control signal A_EN that is generated by the command decoder 501 decoding the external command ECMD is activated (see a step 603). When the activation control signal A_EN is activated at the step 603, the AF control circuit 505 may generate the activation period signal A_PD and the activation active signal A_ACT that are sequentially activated. The row control circuit 509 may receive the activation period signal A_PD and the activation active signal A_ACT, which are sequentially activated, to generate the bank active signal B_ACT that is activated to activate all of memory banks that are included in the data storage circuit 513 when the activation active operation is performed during the activation operation (see a step 605).

Figure 44:
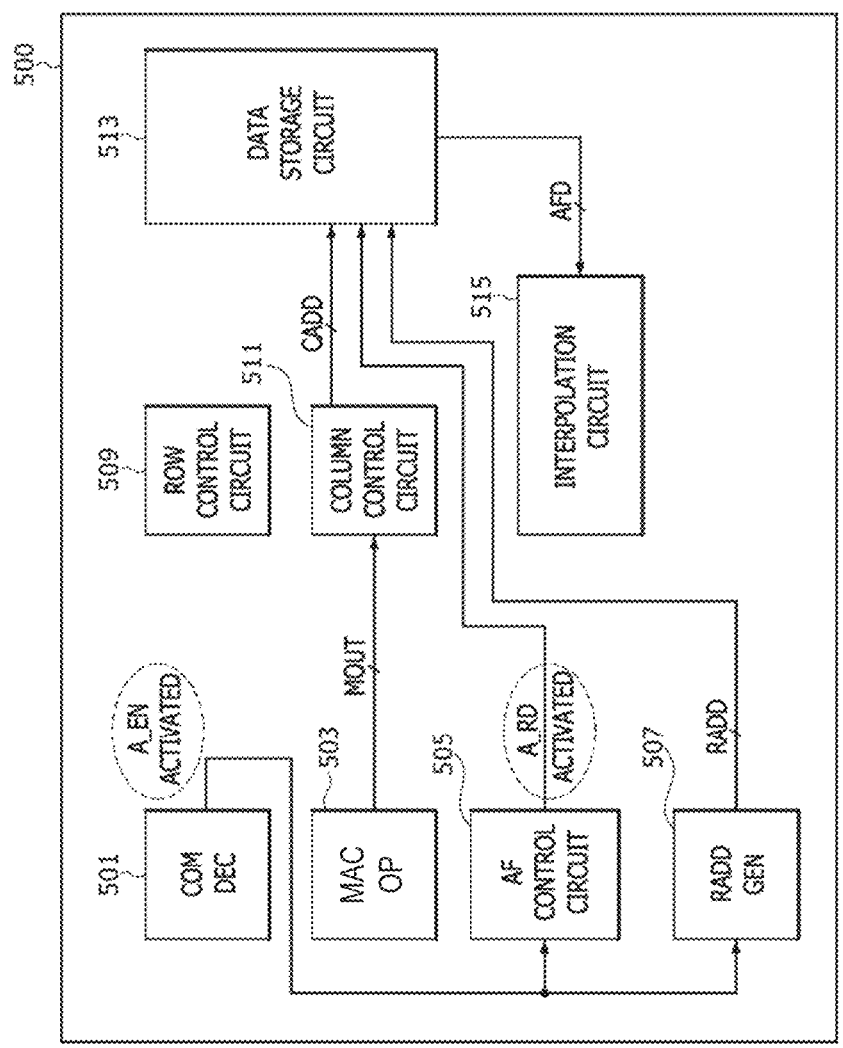

Next, as illustrated in FIGS. 41 and 44, the AF control circuit 505 may generate the activation read signal A_RD, which is activated when a second delay period elapses after the activation active signal A_ACT is activated while the activation control signal A_EN is activated. The row address generation circuit 507 may generate the row address RADD while the activation control signal A_EN is activated. The column control circuit 511 may generate the column address CADD based on the arithmetic result signal MOUT. While the activation read signal A_RD is activated, the activation read operation may be performed to output data stored in memory cells selected by the row address RADD and the column address CADD as the activation data AFD (see a step 607).

Figure 45:
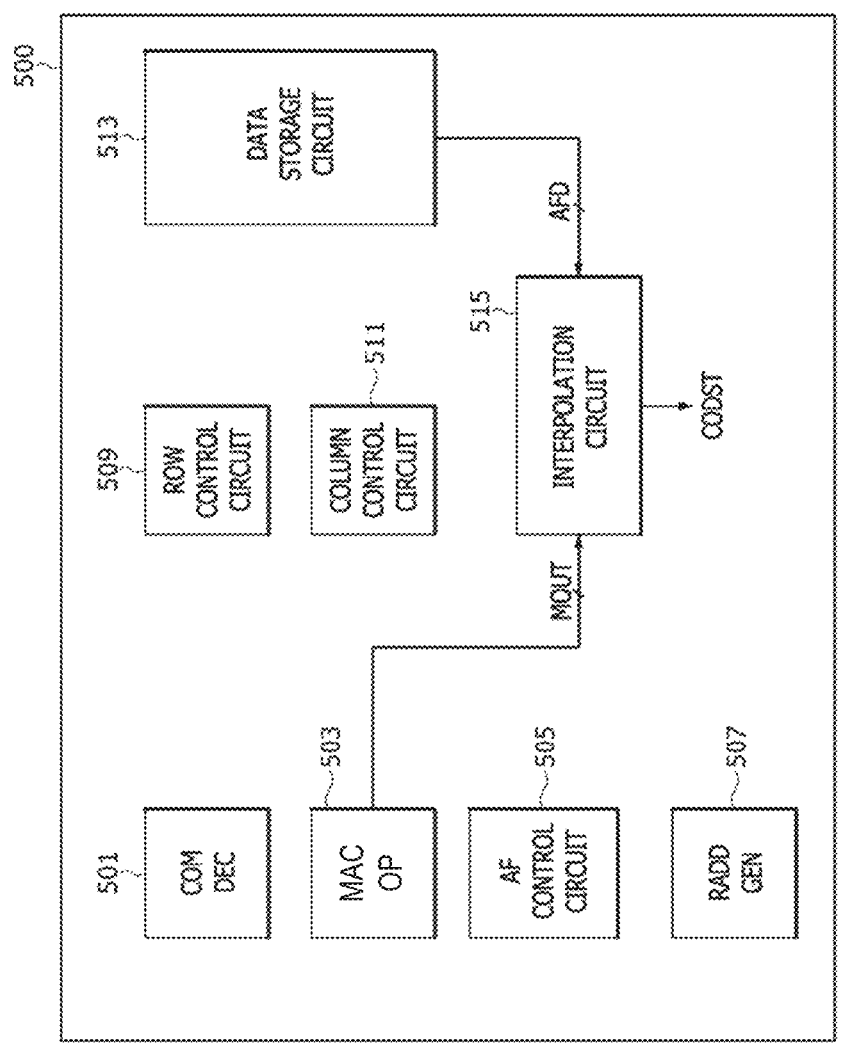

Next, as illustrated in FIGS. 41 and 45, an interpolation operation may be performed to the calibrated output distribution signal CODST based on the arithmetic result signal MOUT and the activation data AFD in the interpolation circuit 515 (see a step 609). The interpolation circuit 515 may perform a multiplying operation for multiplying a value that corresponds to variation of the arithmetic result value by a value that corresponds to variation of the selected activation result value to generate the multiplication result value, may perform an adding operation for adding the multiplication result value to a mantissa of the selected activation result value to generate a calibration signal CMAN, and may generate the calibrated output distribution signal CODST with the calibrated activation result value based on the calibration signal CMAN.

Finally, when the activation pre-charge signal A_PCG is activated, the activation pre-charge operation may be performed (see a step 611). As a result of the activation pre-charge operation, the activation period signal A_PD may be deactivated to terminate the active operation.

As described above, the arithmetic device 500, according to an embodiment, may perform the activation read operation to output the activation data AFD from the data storage circuit 413 based on the arithmetic result signal MOUT that is generated by the MAC arithmetic operation, thereby more readily realizing a circuit that applies the activation function by using the data storage circuit 513. In addition, the arithmetic device 500 may perform the interpolation operation based on the arithmetic result signal MOUT and the activation data AFD when the activation function is applied to the result of the MAC arithmetic operation, thereby generating the calibrated output distribution signal with the calibrated activation result value that is more accurate.

What is claimed is:

1. An arithmetic device comprising:
an activation function (AF) control circuit configured to generate a column address, a data selection signal, and an internal control signal based on an arithmetic result signal and an activation control signal during an activation operation;
a data storage circuit configured to output activation data from a memory cell array that is selected by the column address and a row address;
an output distribution signal generation circuit configured to generate an output distribution signal from the activation data based on the data selection signal and the internal control signal, and
an interpolation circuit configured to perform an interpolation operation based on the arithmetic result signal and the activation data when an activation function is applied to a multiplying-and-accumulating (MAC) arithmetic operation.

2. The arithmetic device of claim 1, further comprising a command decoder configured to decode an external command to generate the activation control signal that is activated during the activation operation and configured to apply the activation control signal to the AF control circuit.

3. The arithmetic device of claim 2, wherein the command decoder is configured to decode the external command to generate an arithmetic control signal,
wherein, when the arithmetic control signal is activated, a MAC circuit is configured to perform the MAC arithmetic operation for vector data and weight data, and
wherein the arithmetic result signal is generated as a result of the MAC arithmetic operation.

4. The arithmetic device of claim 2,
wherein the AF control circuit includes:
a column address generator configured to generate the column address based on the activation control signal and the arithmetic result signal;
a data selection signal generator configured to generate the data selection signal based on the activation control signal and the arithmetic result signal; and
an internal control signal generator configured to generate the internal control signal based on the activation control signal.

5. The arithmetic device of claim 4, wherein the internal control signal generator is configured to generate the internal control signal, which is activated when a predetermined period elapses after the activation control signal is activated.

6. The arithmetic device of claim 1,
wherein the data storage circuit includes multiple memory cell arrays, each of which is selectively accessed based on the column address and the row address, and
wherein the multiple memory cell arrays are configured to store activation functions that are different from each other, respectively.

7. The arithmetic device of claim 1, further comprising a mode register configured to store the row address,
wherein the mode register applies the row address to the data storage circuit.

8. The arithmetic device of claim 1, further comprising an address decoder configured to decode an external address to generate the row address,
wherein the address decoder applies the row address to the data storage circuit.

9. The arithmetic device of claim 1, wherein the output distribution signal generation circuit includes:
a data selector configured to select and output a portion of internal activation data as selected activation data based on a selection decoded signal and the data selection signal; and
an output distribution signal output circuit configured to latch the selected activation data based on the internal control signal to generate and output the output distribution signal.

10. The arithmetic device of claim 9, further comprising a selection signal decoder configured to decode the data selection signal to generate the selection decoded signal.

11. The arithmetic device of claim 9, further comprising an internal activation data generator configured to buffer the activation data based on the internal control signal to generate the internal activation data.

12. The arithmetic device of claim 9, wherein the data selector includes:
a first selection data generator configured to select and output first selection data from the internal activation data based on the selection decoded signal;
a second selection data generator configured to select and output second selection data from the internal activation data based on the selection decoded signal; and
a selection output circuit configured to output the first selection data or the second selection data as the selected activation data based on the data selection signal.

13. The arithmetic device of claim 9, wherein the output distribution signal output circuit includes:
an activation data latch configured to latch the selected activation data based on an output control pulse to output the latched data of the selected activation data as latched activation data; and
an output buffer circuit configured to buffer the latched activation data based on an activation reset signal to generate the output distribution signal.

14. The arithmetic device of claim 13, wherein the output distribution signal output circuit further includes an output control pulse generator configured to generate the output control pulse when an output delay period elapses after the internal control signal is activated.

15. The arithmetic device of claim 13, further comprising a command decoder configured to decode an external command to generate the activation reset signal that is applied to the output buffer circuit.

16. An arithmetic device comprising:
a data storage circuit configured to output activation data from a memory cell array that is selected by a column address, generated from an arithmetic result signal and a row address;
a data selector configured to select and output a portion of internal activation data, which are generated by buffering the activation data, as selected activation data based on a data selection signal that is generated from the arithmetic result signal;
an output distribution signal output circuit configured to latch the selected activation data based on an internal control signal that is generated from an activation control signal to generate and output an output distribution signal, and
an interpolation circuit configured to perform an interpolation operation based on the arithmetic result signal and the activation data when an activation function is applied to a multiplying-and-accumulating (MAC) arithmetic operation.

17. The arithmetic device of claim 16,
wherein the data storage circuit includes multiple memory cell arrays, each of which is selectively accessed based on the column address and the row address; and
wherein the multiple memory cell arrays are configured to store activation functions that are different from each other, respectively.

18. The arithmetic device of claim 16, further comprising a mode register configured to store the row address,
wherein the mode register applies the row address to the data storage circuit.

19. The arithmetic device of claim 16, further comprising an address decoder configured to decode an external address to generate the row address,
wherein the address decoder applies the row address to the data storage circuit.

20. The arithmetic device of claim 16, further comprising a selection signal decoder configured to decode the data selection signal to generate a selection decoded signal.

21. The arithmetic device of claim 20, wherein the data selector includes:
a first selection data generator configured to select and output first selection data from the internal activation data based on the selection decoded signal;
a second selection data generator configured to select and output second selection data from the internal activation data based on the selection decoded signal; and
a selection output circuit configured to output the first selection data or the second selection data as the selected activation data based on the data selection signal.

22. The arithmetic device of claim 16, wherein the output distribution signal output circuit includes:
an activation data latch configured to latch the selected activation data based on an output control pulse to output the latched data of the selected activation data as latched activation data; and
an output buffer circuit configured to buffer the latched activation data based on an activation reset signal to generate the output distribution signal.

23. The arithmetic device of claim 22, wherein the output distribution signal output circuit further includes an output control pulse generator configured to generate the output control pulse when an output delay period elapses after the internal control signal is activated.

24. The arithmetic device of claim 22, further comprising a command decoder configured to decode an external command to generate the activation reset signal that is applied to the output buffer circuit.

25. The arithmetic device of claim 16, further comprising an activation function (AF) control circuit configured to generate the column address, the data selection signal, and the internal control signal from the arithmetic result signal and the activation control signal during an activation operation.

26. The arithmetic device of claim 25, further comprising a command decoder configured to decode an external command to generate the activation control signal that is activated during the activation operation and configured to apply the activation control signal to the AF control circuit.

27. The arithmetic device of claim 26,
wherein the command decoder is configured to decode the external command to generate an arithmetic control signal;
wherein, when the arithmetic control signal is activated, a MAC circuit is configured to perform the MAC arithmetic operation for vector data and weight data; and
wherein the arithmetic result signal is generated as a result of the MAC arithmetic operation.

28. The arithmetic device of claim 26, wherein the AF control circuit includes:
a column address generator configured to generate the column address based on the activation control signal and the arithmetic result signal;
a data selection signal generator configured to generate the data selection signal based on the activation control signal and the arithmetic result signal; and
an internal control signal generator configured to generate the internal control signal based on the activation control signal.

29. The arithmetic device of claim 28, wherein the internal control signal generator is configured to generate the internal control signal, which is activated when a predetermined period elapses after the activation control signal is activated.

* * * * *